(12) United States Patent
Min et al.

(10) Patent No.: US 7,589,013 B2
(45) Date of Patent: Sep. 15, 2009

(54) ELECTRODE STRUCTURE AND METHOD OF MANUFACTURING THE SAME, PHASE-CHANGE MEMORY DEVICE HAVING THE ELECTRODE STRUCTURE AND METHOD OF MANUFACTURING THE SAME

(75) Inventors: Chung-Ki Min, Yongin-si (KR); Yong-Sun Ko, Suwon-si (KR); Kyung-Hyun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 11/484,676

(22) Filed: Jul. 12, 2006

(65) Prior Publication Data
US 2007/0057308 A1 Mar. 15, 2007

(30) Foreign Application Priority Data
Jul. 13, 2005 (KR) .................. 10-2005-0063326

(51) Int. Cl.
*H01L 21/4763* (2006.01)
(52) U.S. Cl. .................. 438/622; 438/637; 257/E21.58
(58) Field of Classification Search ........... 438/622, 438/624, 626, 637, 638, 639; 257/E21.58
See application file for complete search history.

(56) References Cited

U.S. PATENT DOCUMENTS 6,803,304 B2 * 10/2004 Asami .................. 438/613
6,893,954 B2 * 5/2005 Maekawa .................. 438/622

FOREIGN PATENT DOCUMENTS

| JP | 2004-349709 | 12/2004 |
| KR | 10-2004-0054250 | 6/2004 |
| KR | 437458 | 6/2004 |

* cited by examiner

*Primary Examiner*—David S Blum
(74) *Attorney, Agent, or Firm*—Harness, Dickey & Pierce, P.L.C.

(57) ABSTRACT

Example embodiments of the present invention relate to an electrode structure, a method of manufacturing the electrode structure, a phase-change memory device having the electrode structure and a method of manufacturing the phase-change memory device. The electrode structure may include a pad, a first insulation layer pattern, a second insulation layer pattern and/or an electrode. The first insulation layer pattern may be formed on the pad. The first insulation layer pattern may have a first opening that partially exposes the pad. The second insulation layer pattern may be formed on the first insulation layer pattern. The second insulation layer pattern may have a second opening connected to the first opening. The electrode may be formed on the pad and filling the first and the second openings.

7 Claims, 20 Drawing Sheets

ELECTRODE STRUCTURE AND METHOD OF MANUFACTURING THE SAME, PHASE-CHANGE MEMORY DEVICE HAVING THE ELECTRODE STRUCTURE AND METHOD OF MANUFACTURING THE SAME

PRIORITY STATEMENT

This application claims the benefit of priority under 35 U.S.C. § 119 to Korean Patent Application No. 2005-63326, filed on Jul. 13, 2005, the contents of which are herein incorporated by references in their entirety.

BACKGROUND OF THE INVENTION

1. Field of the Invention

Example embodiments of the present invention relate to an electrode structure, a method of manufacturing the electrode structure, a phase-change memory device having the electrode structure and a method of manufacturing the phase-change memory device. Other example embodiments of the present invention relate to an electrode structure having increased characteristics, a method of manufacturing the electrode structure, a phase-change memory device having the electrode structure and a method of manufacturing the phase-change memory device.

2. Description of the Related Art

There are several types of semiconductor memory devices (e.g., static random access memory (SRAM) devices, dynamic random access memory (DRAM) devices, flash memory devices or the like). The semiconductor devices may be divided into two classes, volatile memory devices and non-volatile memory devices, depending on whether data is retained when the power supply is turned off or deactivated. Among the non-volatile memory devices, flash memory devices may be used in electronic devices (e.g., a digital camera, a cellular phone, and a MP3 player) for maintaining data. Flash memory devices may require a longer amount of time for reading or writing data such that alternative memory devices may be necessary. For example, the alternative memory devices may include ferroelectric RAM (FRAM) devices, magnetic RAM (MRAM) devices, phase-change RAM (PRAM) devices or the like.

The phase-change memory devices may include a phase-change material layer. A crystalline structure of the phase-change material layer may vary in accordance with an amount of heat generated by a current applied to the phase-change material layer, The phase-change material layer used in the phase-change memory devices may include chalcogenide (e.g., germanium-antimony-tellurium (Ge—Sb—Te) (also known as GST)). The crystalline structure of the phase-change material layer may vary according to a time duration and the mount of heat generated by the current applied thereto.

Amorphous phase-change material may have a relatively higher specific resistance, and crystalline phase-change material may have a relatively lower specific resistance. Phase-change memory devices may be altered to store data therein by utilizing various resistances of different phase-change materials. In order to maintain more uniformly resistance characteristics, an electrode of the phase-change memory device may have a smaller cross section and a more uniform surface.

Conventional methods of manufacturing a phase-change memory device have been acknowledged.

FIGS. 1A to 1D are diagrams illustrating cross sectional views of a conventional method of manufacturing a phase-change memory device.

Referring to FIG. 1A, a first insulating interlayer 10 may be formed on a substrate (not shown) using an oxide. The substrate may include a transistor having a gate structure and source/drain regions. A first pad 15 may be formed through the first insulating interlayer 10. The first pad 15 may include a conductive material and may contact the source/drain region of the transistor.

A second insulating interlayer 20 may be formed on the first pad 15 and the first insulating interlayer 20 using an oxide. A second pad 25 that contacts the first pad 14 may be formed through the second insulating interlayer 20.

A silicon oxynitride layer 30 and a silicon oxide layer 35 may be sequentially formed on the second pad 25 and the second insulating interlayer 20.

Referring to FIG. 1B, the silicon oxynitride layer 30 and the silicon oxide layer 35 may be partially etched by a lithography process, forming a silicon oxynitride layer pattern 32 and a silicon oxide layer pattern 37. The silicon oxynitride layer pattern 32 and the silicon oxide layer pattern 37, collectively, may have an opening 40 exposing the second pad 25. A conductive layer 45 may be formed on the silicon oxide layer pattern 37 to cover the opening 40.

Referring to FIG. 1C, the conductive layer 45 may be partially removed by a chemical mechanical polishing (CMP) process until the silicon oxide layer pattern 37 is exposed, forming a conductive layer pattern within the opening 40.

The silicon oxide layer pattern 37 may be removed by an etch-back process to expose the silicon oxynitride layer pattern 32. The conductive layer pattern may protrude from an upper surface of the silicon oxynitride layer pattern 32 in a pillar shape.

An upper portion of the protruded the conductive layer pattern may be removed by a CMP process to form a lower electrode 50 within the silicon oxynitride layer pattern 32.

Referring to FIG. 1D, a phase-change layer pattern 55 and an upper electrode 60 may be sequentially formed on the lower electrode 50 and the silicon oxynitride layer pattern 32.

A third insulating interlayer 65 may be formed using an oxide to cover the upper electrode 60. A fourth insulating interlayer 68 may be formed on the third insulating interlayer 65 and the upper electrode 60.

The fourth insulating interlayer 68 may be partially etched to expose the upper electrode 60. An upper contact 70 may be formed on the upper electrode 60. An upper wiring 75 may be formed on the upper contact 70 and the fourth insulating interlayer 68, forming a phase-change memory device.

According the conventional method, the conductive layer pattern and the silicon oxynitride layer pattern 32 may have a relatively lower etching selectivity in the CMP process using metal slurry for forming the lower electrode 50. The silicon oxynitride layer pattern 32 may be etched more than the conductive layer. Alternatively, the conductive layer may be etched more than the silicon oxynitride layer pattern 32. The silicon oxynitride layer pattern 32 may be etched simultaneously with the conductive layer in a formation of the lower electrode 50. After forming the lower electrode 50, a thickness of the silicon oxynitride layer pattern 32 may not be uniform and roughness of the lower electrode 50 may increase. As an initial thickness of the lower electrode 50 and the silicon oxynitride layer pattern 32 may be increased, forming the phase-change layer pattern 55 on the lower electrode 50 and the silicon oxynitride layer pattern 32 may be more difficult. As a surface of the lower electrode 50 becomes rougher, electric characteristics of the lower electrode 50 may be deteriorate such that properties of the phase-change memory device including the lower electrode 50 may deteriorate.

SUMMARY OF THE INVENTION

Example embodiments of the present invention relate to an electrode structure, a method of manufacturing the electrode structure, a phase-change memory device having the electrode structure and a method of manufacturing the phase-change memory device.

Example embodiments of the present invention provide an electrode structure having increased characteristics and a method of manufacturing the same. Other example embodiments of the present invention provide a phase-change memory device having an electrode structure having increased characteristics and method of manufacturing the same.

According to example embodiments of the present invention, there is provided an electrode structure. The electrode structure may include a pad, a first insulation layer pattern formed on the pad and having a first opening partially exposing the pad, a second insulation layer pattern formed on the first insulation layer pattern and having a second opening through the first opening and/or an electrode formed on the pad and filling the first and second openings. In example embodiments of the present invention, the electrode structure may include a spacer formed on a sidewall of the electrode.

In example embodiments of the present invention, the electrode may include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or the like.

In example embodiments of the present invention, the first insulation layer pattern may include a material having an etching selectivity relative to that of the second insulation layer pattern. In example embodiments of the present invention, the first insulation layer pattern may include silicon nitride or silicon oxynitride.

According to example embodiments of the present invention, the second insulation layer pattern may include tetra ethyl ortho silicate (TEOS), spin on glass (SOG), flowable oxide (FOX), boro phosphor silicate glass (BPSG), phosphor silicate glass (PSG) or high density plasma-chemical vapor deposition (HDP-CVD) oxide.

According to other example embodiments of the present invention, there is provided a phase-change memory device. The phase-change memory device may include a substrate having a contact region, an insulation layer formed on the substrate, a pad connected with the contact region through the insulation layer, a first insulation layer pattern formed on the pad and including a first opening partially exposing the pad, a second insulation layer pattern formed on the first insulation layer pattern and having a second opening through the first opening, a first electrode formed on the pad and filling the first and second openings, a phase-change layer pattern formed on the first electrode and/or a second electrode formed on the phase-change layer pattern.

In example embodiments of the present invention, the first insulation layer pattern may include silicon nitride or silicon oxynitride. The second insulation layer pattern may include TEOS, SOG, FOX, BPSG, PSG, HDP-CVD oxide or the like.

According to other example embodiments of the present invention, there is provided a method of manufacturing an electrode structure. The method of manufacturing the electrode structure may include forming a pad. A first insulation layer pattern having a first opening partially exposing the pad may be formed on the pad. A second insulation layer pattern, which has a second opening through the first opening, may be formed on the first insulation layer pattern. An electrode filling the first and the second openings may be formed on the pad.

In example embodiments of the present invention, the first and the second insulation layer patterns may be formed simultaneously.

In example embodiments of the present invention, a first insulation layer and a second insulation layer may be formed on the pad. The second and the first openings exposing the pad may be formed by partially etching the second and the first insulation layers, respectively.

In example embodiments of the present invention, a third insulation layer and a fourth insulation layer may be formed on the second insulation layer. A fourth insulation layer pattern and a third insulation layer pattern, which collectively have a third opening formed on the second opening, may be formed by partially etching the fourth and the third insulation layer, respectively. A conductive layer may be formed on the fourth insulation layer pattern to fill the first opening, the second opening and the third opening. A preliminary electrode filling the first opening, the second opening and the third opening may be formed by partially removing the conductive layer until the fourth insulation layer pattern is exposed.

In example embodiments of the present invention, the preliminary electrode may be formed by a first chemical mechanical polishing (CMP) process using a first slurry.

According to yet other example embodiments of the present invention, there is provided a method of manufacturing a phase-change memory device. In the method, a contact region may be formed on a substrate. An insulating interlayer may be formed on the substrate. A pad, within the insulating interlayer and electrically connected to the contact region, may be formed. A first insulation layer pattern having a first opening partially exposing the pad may be formed on the pad. A second insulation layer pattern having a second opening connected to the first opening may be formed on the first insulation layer pattern. A first electrode filling the first opening and the second opening may be formed on the pad. A phase-change layer pattern may be formed on the first electrode and the second insulation layer pattern. A second electrode may be formed on the phase-change layer pattern.

In example embodiments of the present invention, an insulation layer may be formed on the second insulation layer. The insulation layer pattern, which has a third opening formed on the second opening, may be formed by etching the insulation layer. A conductive layer on the insulation layer pattern may be formed to cover the first opening, the second opening and the third opening. A preliminary electrode filling the first opening, the second opening and the third opening may be formed by partially removing the conductive layer until the insulation layer pattern is exposed.

In example embodiments of the present invention, the conductive layer may be removed by a CMP process using a slurry that includes an abrasive having ceria, alumina and/or silica.

According example embodiments of the present invention, first and second insulation layer patterns surround and support an electrode such that structural stability of an electrode structure may increase. In a chemical mechanical polishing process for forming the electrode, the second insulation layer pattern has a relatively higher etching selectivity relative to that of the electrode. As such, the second insulation layer may have a more uniform thickness and roughness of the electrode also may decrease. When the electrode structure is applied to a phase-change memory device, the phase-change memory device may have a more consistent resistance and increased characteristics.

BRIEF DESCRIPTION OF THE DRAWINGS

Example embodiments of the present invention will be more clearly understood from the following detailed description taken in conjunction with the accompanying drawings. FIGS. 1-6 represent non-limiting, example embodiments of the present invention as described herein.

FIG. 2 is a diagram illustrating a cross sectional view of an electrode structure according to example embodiments of the present invention;

FIG. 3 is a flow chart illustrating a method of manufacturing an electrode structure according to example embodiments of the present invention;

FIG. 5 is a diagram illustrating a cross sectional view of a phase-change memory device according to example embodiments of the present invention;

FIGS. 6A to 6I are diagrams illustrating cross sectional views of a method of manufacturing a phase-change memory device according to example embodiments of the present invention.

DETAILED DESCRIPTION OF EXAMPLE EMBODIMENTS

Figure 1A:
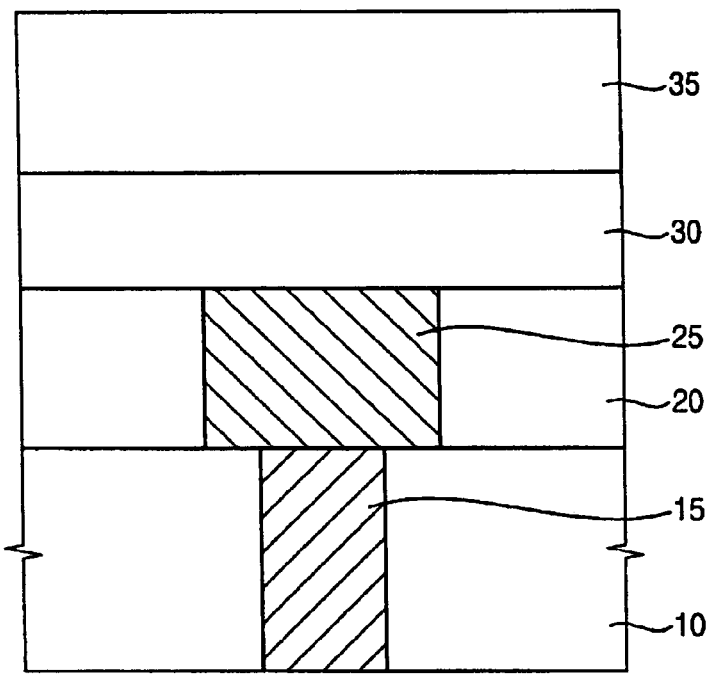
FIGS. 1A to 1D are diagrams illustrating cross sectional views of a method of manufacturing a conventional phase-change memory device.
Figure 1B:
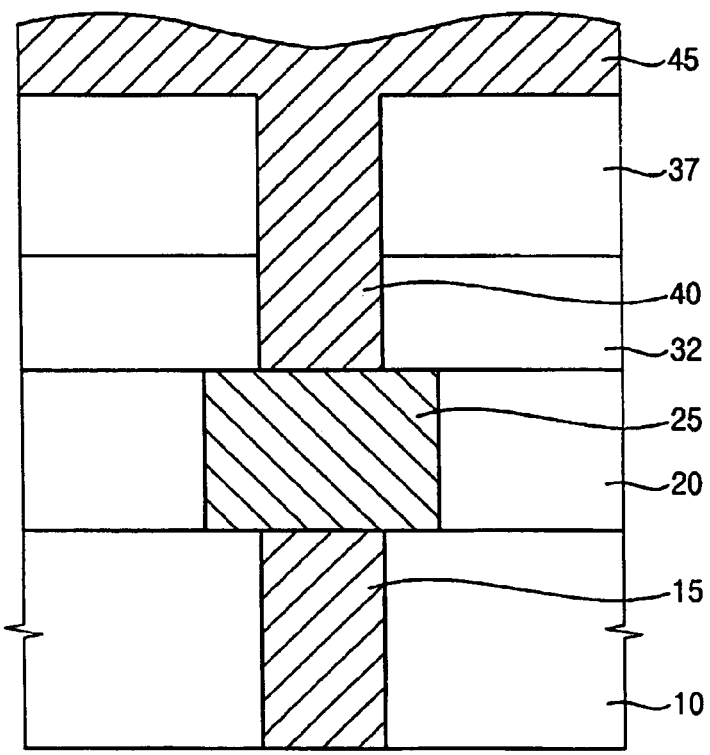
Figure 1C:
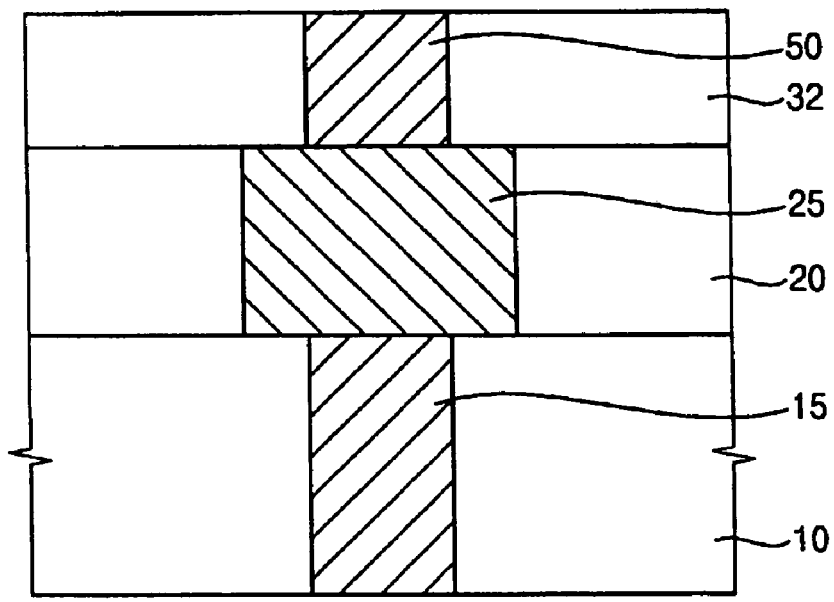
Figure 1D:
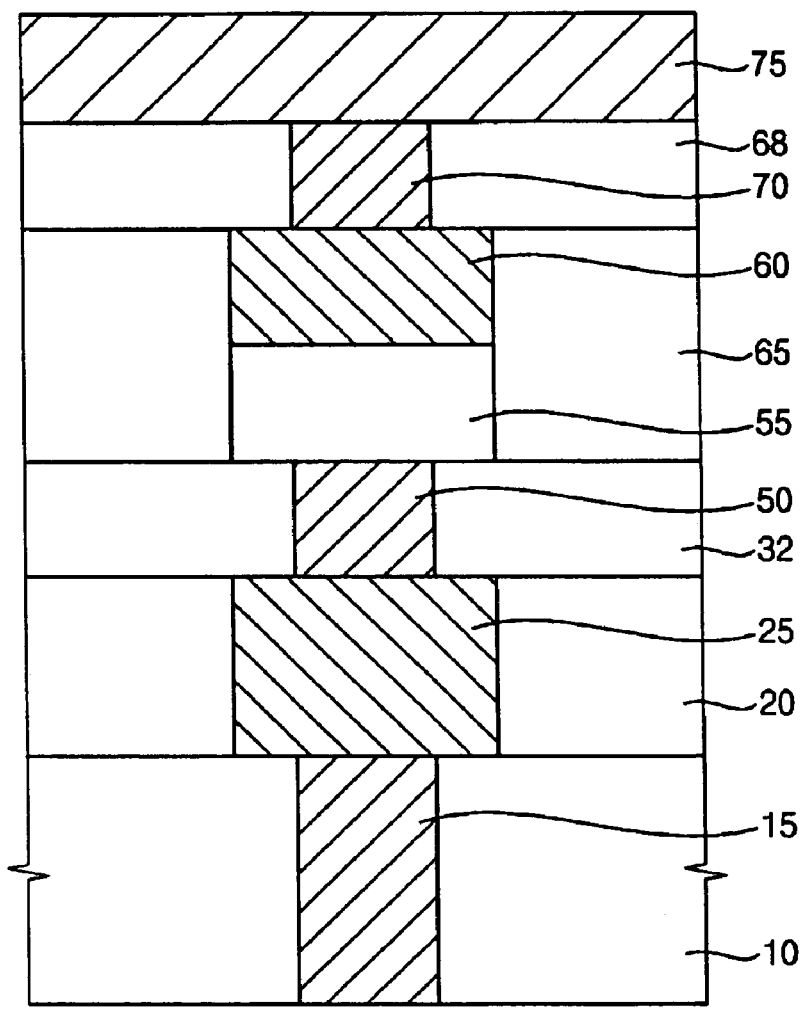

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to an electrode structure, a method of manufacturing the electrode structure, a phase-change memory device having the electrode structure and a method of manufacturing the phase-change memory device. Other example embodiments of the present invention relate to an electrode structure having increased characteristics, a method of manufacturing the electrode structure, a phase-change memory device having the electrode structure and a method of manufacturing the phase-change memory device.

An electrode structure and method of manufacturing the same will now be described.

Figure 2:
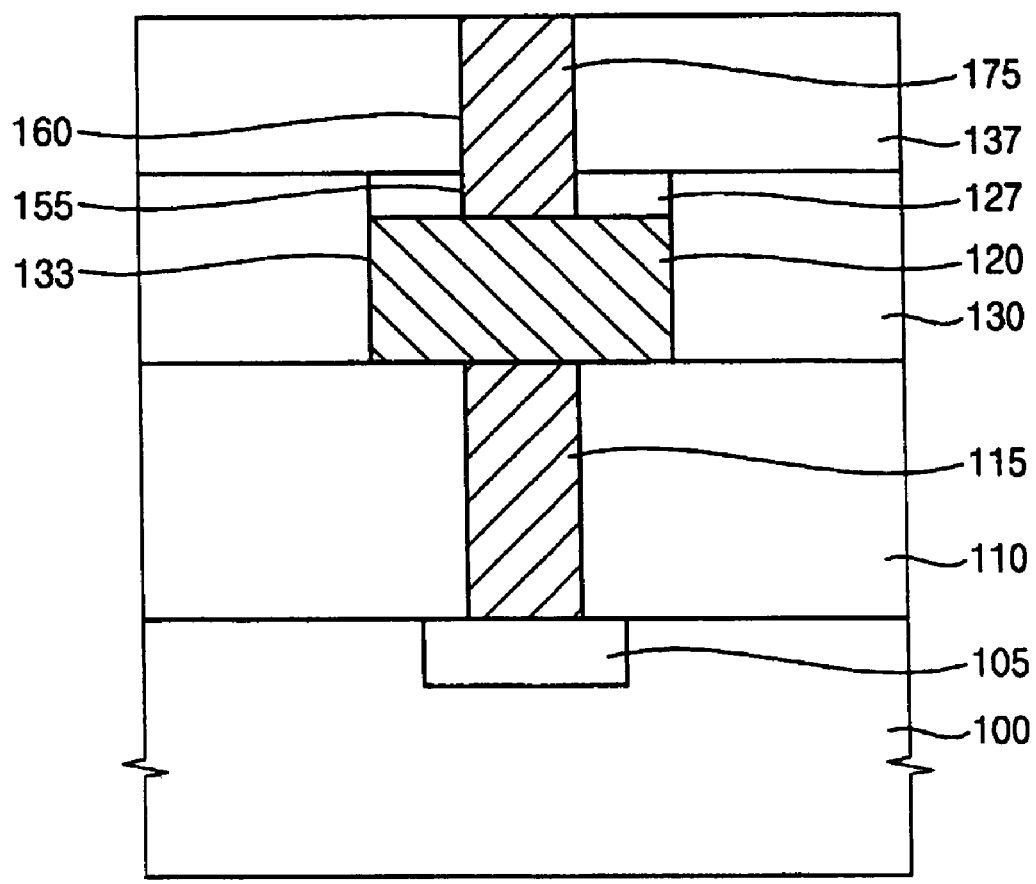

FIG. 2 is a diagram illustrating a cross sectional view of an electrode structure according to example embodiments of the present invention.

Referring to FIG. 2, the electrode structure may include a pad 120, a first insulation layer pattern 127, a second insulation layer pattern 137 and/or an electrode 175.

The first insulation layer pattern 127 may be positioned on the pad 120. The first insulation layer pattern 127 may include a first opening 155 that partially exposes the pad 120. The second insulation layer pattern 137 may be formed on the first insulation layer pattern 127. The second insulation layer pattern 137 includes a second opening 160 formed on the first opening 155. The second opening 160 may open into the first opening 155 such that the first and second openings form a single opening.

The electrode 175 may be formed on the pad 120 to fill the first opening 155 and the second opening 160. The first insulation layer pattern 127 and the second insulation layer pattern 137 may surround, or encompass, the electrode 175. For example, the electrode 175 may be within the first insulation layer pattern 127 and the second insulation layer pattern 137.

The electrode structure may be formed on a substrate 100 (e.g., a silicon wafer, a silicon-on-insulator (SOI) substrate, a single crystalline metal oxide substrate or the like). The substrate 100 may include a lower structure 105 (e.g., a contact region, a pad, a conductive pattern, a wiring and/or a transistor).

A first insulating interlayer 110 may be formed on the substrate 100 to cover the lower structure 105. The first insulating interlayer 110 may include an oxide. For example, the first insulating interlayer 110 may include phosphor silicate glass (PSG), boro-phosphor silicate glass (BPSG), un-doped silicate glass (USG), spin on glass (SOG), tetra ethyl ortho silicate (TEOS), plasma enhanced-TEOS (PE-TEOS), flowable oxide (FOX), high density plasma-chemical vapor deposition (HDP-CVD) oxide or the like.

In example embodiments of the present invention, a contact 115 contacting the lower structure 105 may be formed through the first insulating interlayer 110. The contact 115 may be positioned between the lower structure 105 and the pad 120 of the electrode structure. The contact 115 may electrically connect the pad 120 to the lower structure 105. The contact 115 may include a metal or a conductive metal nitride. For example, the contact 115 may include tungsten, titanium, tantalum, aluminum, copper, titanium nitride, tantalum nitride, aluminum nitride or a combination thereof.

In other example embodiments of the present invention, the pad 120 may be directly formed on the lower structure 105 without forming the first insulating interlayer 110 and the contact 115.

When the first insulating interlayer 110 and the contact 115 are formed on the substrate 100, the pad 120 may be positioned on the first insulating interlayer 110 and the contact 115. The pad 120 may include polysilicon doped with impurities, a metal and/or a conductive metal nitride. For example, the pad 120 may include tungsten, titanium, tantalum, aluminum, copper, titanium nitride, tantalum nitride, aluminum nitride or a combination thereof.

A second insulating interlayer 130 may be formed on the first insulating interlayer 110 to be formed at sides of, or enclosing, the pad 120 and the first insulation layer pattern 127. The second insulating interlayer 130 may include a pad opening 133 that exposes the contact 115 and a portion of the first insulating interlayer 110. The pad 120 may be formed on the contact 115 and the first insulating interlayer 110 to partially fill the pad opening 133. The second insulating interlayer 130 may include an oxide. For example, the second insulating interlayer 130 may include PSG, BPSG; USG, SOG, FOX, TEOS, PE-TEOS, HDP-CVD oxide or the like. In example embodiments of the present invention, the second insulating interlayer 130 may include the oxide substantially the same as that of the first insulating interlayer 110. In other example embodiments of the present invention, the second insulating interlayer 130 may include the oxide substantially different from that of the first insulating interlayer 110.

The first insulation layer pattern 127 may be formed on the pad 120 to fill the pad opening 133. The first insulation layer pattern 127 may have the first opening 155, partially exposing the pad 120. The first insulation layer pattern 127 may be formed at sides of, or enclosing, a lower portion of the electrode 175. The first insulation layer pattern 127 may contact the pad 120. The first insulation layer pattern 127 may support the electrode 175. The first insulation layer pattern 127 may include a material that has an etching selectivity relative to the second insulating interlayer 130, the pad 120 and/or the electrode 175. For example, the first insulating interlayer 127 may include a nitride (e.g., silicon nitride) or an oxynitride (e.g., silicon oxynitride).

The second insulation layer pattern 137 may be formed on the first insulation layer pattern 127 and the second insulating interlayer 130. The second insulation layer pattern 136 may have the second opening 160 partially exposing the pad 120. For example, the second opening 160 may be connected to the first opening 155. The second insulation layer pattern 137 may include a material that has an etching selectivity relative to that of the first insulation layer pattern 127 and the electrode 175. For example, the second insulation layer pattern 137 may include TEOS, PE-TEOS, PSG, BPSG, USG, FOX, SOG, HDP-CVD oxide or the like.

In example embodiments of the present invention, the first opening 155 may have a diameter substantially the same as that of the second opening 160. In other example embodiments of the present invention, a diameter of the first opening 155 may be substantially larger than that of the second opening 160. In yet other example embodiments of the present invention, the first opening 155 may have a diameter substantially smaller than that of the second opening 160.

The electrode 175 may be formed on the pad 120 to fill the first opening 155 and the second opening 160. The second insulation layer pattern 137 may be formed at sides of, or enclosing, an upper portion of the electrode 175. The first insulation layer pattern 127 may be formed at side of, or enclosing, the lower portion of the electrode 175. The lower portion of the electrode 175 may be supported by the first insulation layer pattern 127. The upper portion of the electrode 175 may be supported by the second insulation layer pattern 137. As such, a structural stability of the electrode 175 may increase due to support from the first insulation layer pattern 127 and the second insulation layer pattern 137.

Figure 7:
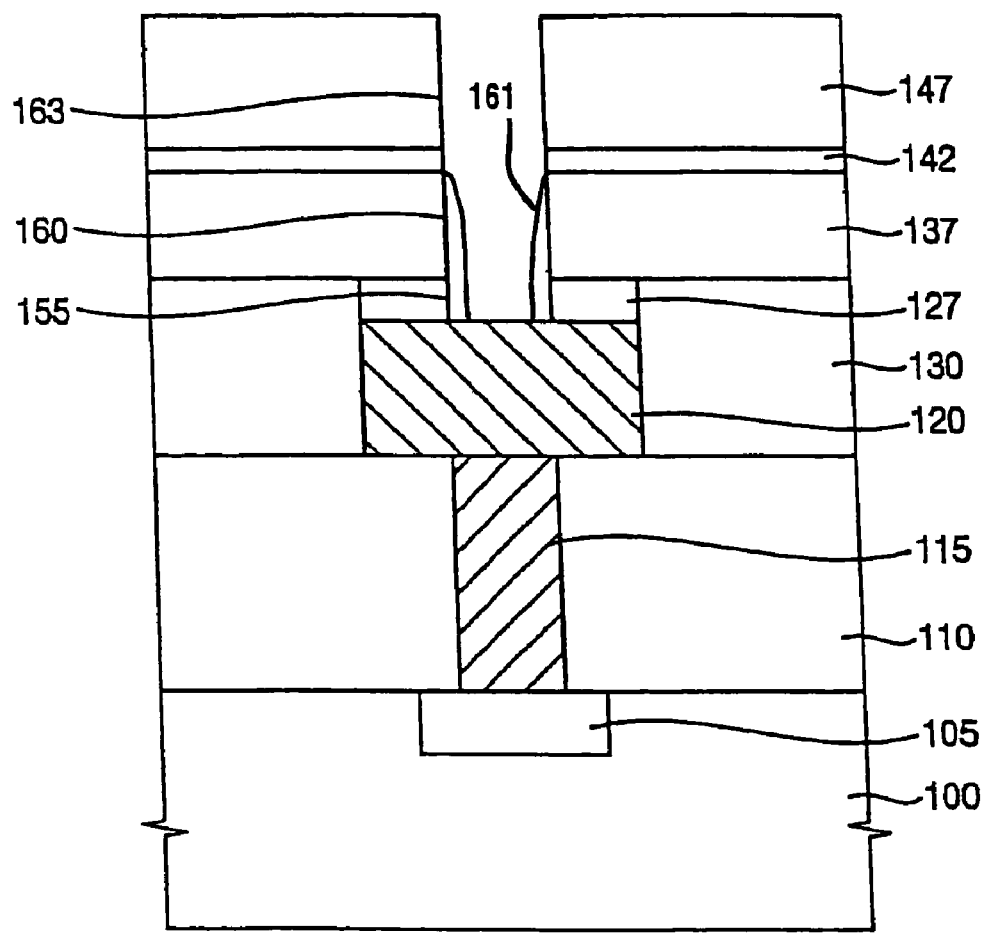
FIG. 7 is a diagram illustrating a method of manufacturing an electrode structure according to example embodiments.

In other example embodiments of the present invention, the electrode structure may include a spacer (for example, spacer 161 shown in FIG. 7) formed between sidewalls of the first opening 155, the second opening 160 and/or a sidewall of the electrode 175. When the spacer is formed between the sidewall of the electrode 175, the sidewall of the first opening 155 and the second opening 160, the diameters of the first opening 155 and the second opening 160 may be reduced to a thickness of the spacer. The diameters of the first opening 155 and the second opening 160 may be reduced to twice the thickness of the spacer. When a conductive layer is formed to fill the first opening 155 and the second opening 160 for forming the electrode 175, the likelihood of a seam, a void and/or a cavity forming in the conductive layer may be prevented or reduced. As the diameters of the first opening 155 and the second opening 160 are decreased, a size of the electrode 175 may also decreased such that a current intensity passing through the electrode 175 may be increased.

The electrode 175 may be positioned on the pad 120 to fill the first opening 155 and the second opening 160. The electrode 175 may include polysilicon doped with impurities, a metal and/or a conductive metal nitride. For example, the electrode 175 may include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or a combination thereof.

A conductive layer, an insulation layer and/or a phase-change layer may be more easily formed on the second insulation layer pattern 137 and the electrode 175 because the second insulation layer pattern 137 and the electrode 175 have a more uniform thickness and variation of the thickness of the second insulation layer patter 137 and the electrode 175 is smaller.

Figure 3:
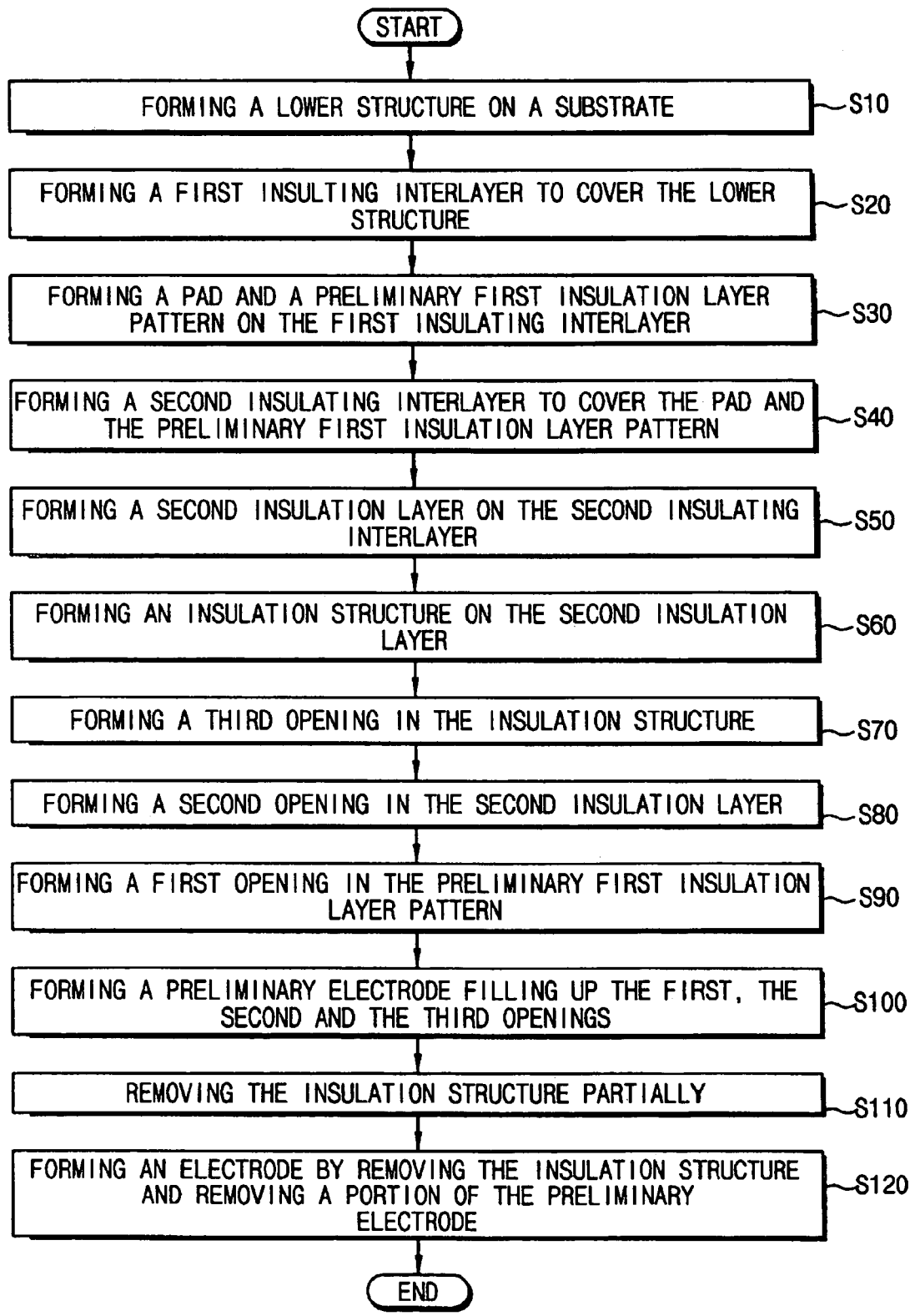

FIG. 3 is a flow chart illustrating a method of manufacturing an electrode structure according to example embodiments of the present invention. FIGS. 4A to 4G are diagrams illustrating cross sectional views of a method of manufacturing an electrode structure according to example embodiments of the present invention.

Figure 4A:
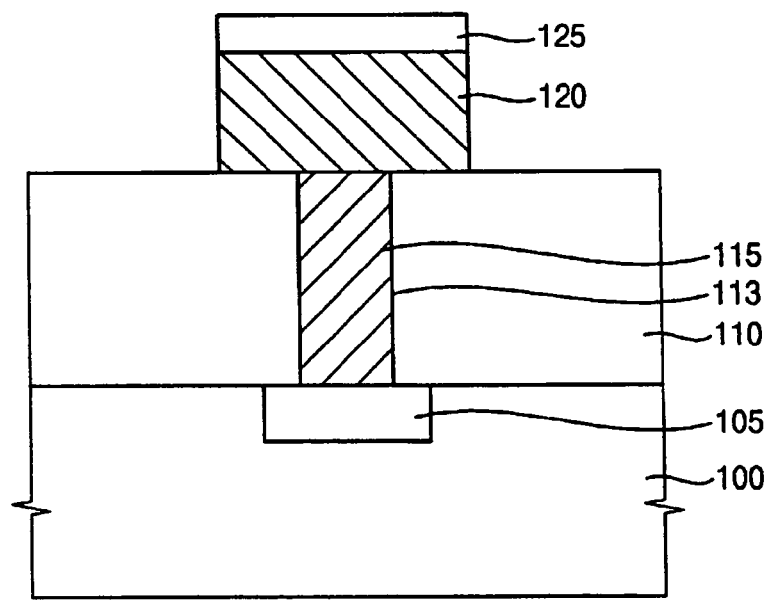
FIGS. 4A to 4G are diagrams illustrating cross sectional views of a method of manufacturing an electrode structure according to example embodiments of the present invention.

Referring to FIGS. 3 and 4A, a lower structure 105 may be formed on a substrate 100 (e.g., a silicon wafer, a SOI substrate) or a single crystalline metal oxide substrate in S10. The lower structure 105 may include a contact region, a pad, a conductive pattern, a wiring, a transistor and the like formed on the substrate 100.

A first insulating interlayer 110 may be formed on the substrate 100 to cover the lower structure 105 in S20. The first insulating interlayer 110 may be formed by a chemical vapor deposition (CVD) process, a plasma enhanced-CVD (PE-CVD) process, an atomic layer deposition (ALD) process, a high density plasma-CVD (HDP-CVD) process or similar process. The first insulating interlayer 110 may be formed using an oxide (e.g., BPSG, PSG, USG, FOX, PE-TEOS, HDP-CVD oxide or the like).

The first insulating interlayer 110 may be partially etched to form a contact hole 113 through the first insulating interlayer 110. A first conductive layer may be formed on the first insulating interlayer 110 to fill the contact hole 113. The first conductive layer may be formed using a metal or a conductive metal nitride. For example, the first conductive layer may be formed using tungsten, titanium, tantalum, aluminum, copper, titanium nitride, tantalum nitride, aluminum nitride or a combination thereof. The first conductive layer may be formed by a sputtering process, a CVD process, an ALD process, a pulsed laser deposition (PLD) process or similar process.

The first conductive layer may be partially removed by a chemical mechanical polishing (CMP) process, an etch-back process, or a combination process of CMP and etch back. The first conductive layer may be partially removed until the first insulating interlayer 110 is exposed. A contact 115 filling the contact hole 113 may be formed on the lower structure 105. The contact 115 may contact the lower structure 105 including the contact region.

A second conductive layer may be formed on the first insulating interlayer 110 and the contact 115. The second conductive layer may be formed using a metal or a conductive metal nitride. For example, the second conductive layer may be formed using tungsten, titanium, tantalum, aluminum, copper, titanium nitride, tantalum nitride, aluminum nitride or a combination thereof. The second conductive layer may be formed by a sputtering process, a CVD process, an ALD process, a PLD process or similar process.

A first insulation layer may be formed on the second conductive layer. The first insulation layer may be formed using a nitride or an oxynitride. For example, the first insulation layer may be formed using silicon nitride, silicon oxynitride or the like. The first insulation layer may be formed by a CVD process, a PE-CVD process, an ALD process or similar process.

A first photoresist pattern (not shown) may be formed on the first insulation layer. The first insulation layer and the second conductive layer may be partially etched using the first photoresist pattern as an etching mask, forming a pad 120 and a preliminary first insulation layer pattern 125 in S30. The pad 120 may be formed on the contact 115 and the first insulating interlayer 110. The preliminary first insulation layer pattern 125 may be formed on the pad 120. The first photoresist pattern may be removed by an ashing process and/or a stripping process.

In example embodiments of the present invention, the first insulation layer may be etched using the first photoresist pattern as an etching mask, forming the preliminary first insulation layer pattern 125 on the second conductive layer. After removing the first photoresist pattern, the second conductive layer may be etched using the preliminary first insulation layer pattern 125 as an etching mask, forming the pad 120 on the first insulating interlayer 110 and the contact 115.

Figure 4B:
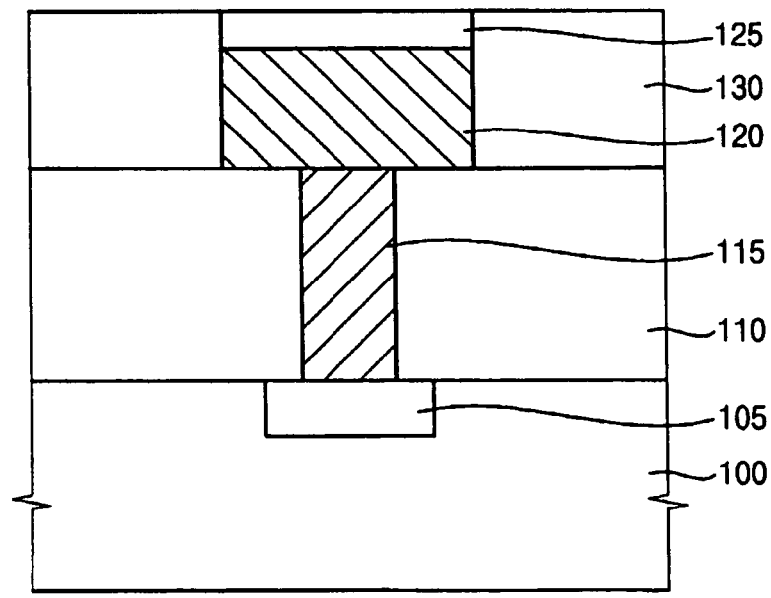

Referring to FIGS. 3 and 4B, a second insulating interlayer 130 may be formed on the first insulating interlayer 110 to cover the pad 120 and the preliminary first insulation layer pattern 125 in S40. The second insulating interlayer 130 may be formed using an oxide (e.g., PSG, BPSG, TEOS, USG, FOX, SOG, HDP-CVD oxide or the like). The second insulating interlayer 130 may be formed by a CVD process, an ALD process, a PE-CVD process, an HDP-CVD process or similar process.

The second insulating interlayer 130 may be partially removed by a CMP process, an etch back process or a combination process of CMP and etch back, until the preliminary first insulation layer pattern 125 is exposed. The second insulating interlayer 130 may have a planarized surface. The preliminary first insulation layer pattern 125 and the pad 120 may be within the second insulating interlayer 130. The second insulating interlayer 130 may be formed at side of, or enclosing, the preliminary first insulation layer pattern 125 and the pad 120.

Figure 4C:
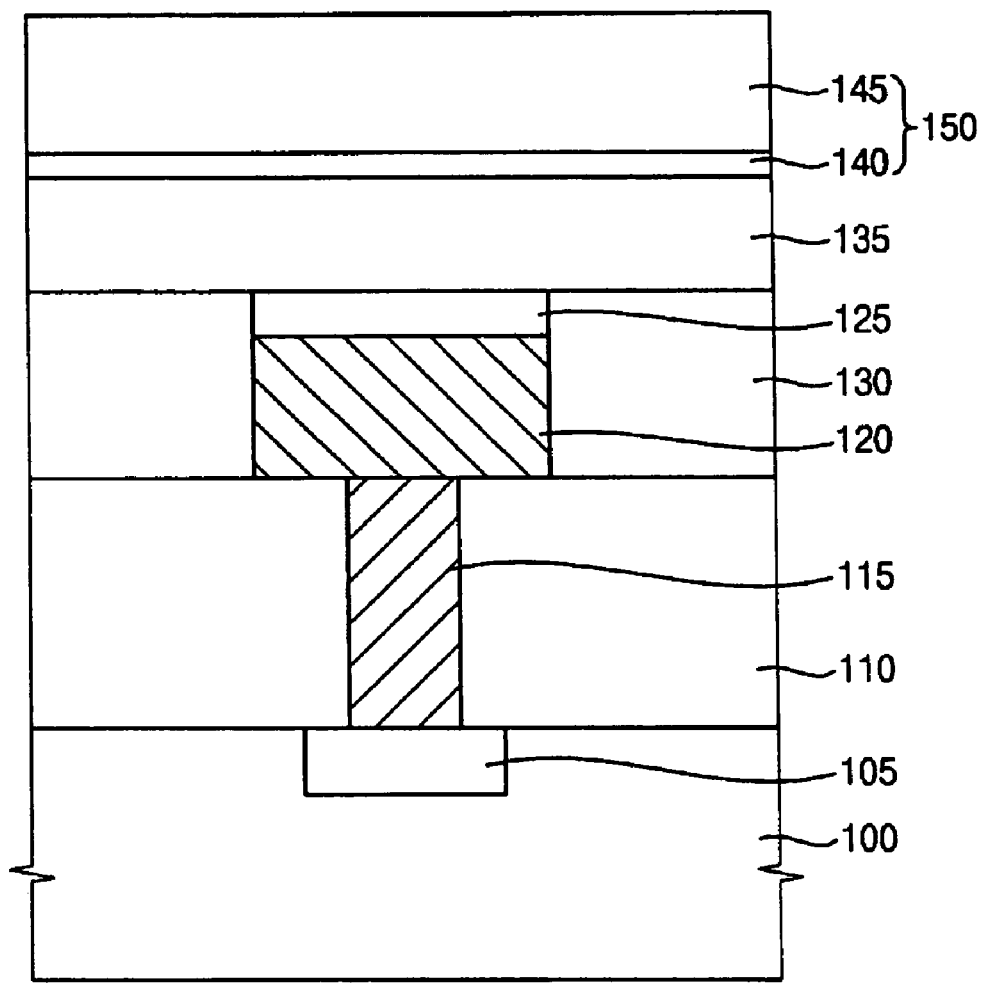

Referring to FIGS. 3 and 4C, a second insulation layer 135 may be formed on the on the second insulating interlayer 130 and the preliminary first insulation layer pattern 125 in S50. The second insulation layer 135 may be formed by a thermal oxidation process, a CVD process, a PE-CVD process, an ALD process, an HDP-CVD process or similar process. The second insulation layer 135 may be formed using an oxide. For example, the second insulation layer 135 may be formed using USG, SOG, TEOS, PE-TEOS, PSG, BPSG, FOX, HDP-CVD oxide or the like.

An insulation structure 150 including a third insulation layer 140 and a fourth insulation layer 145 may be formed on the second insulation layer 135 in S60. The fourth insulation layer 145 may be formed by a CVD process, a PE-CVD process, an ALD process, an HDP-CVD process or similar process. The fourth insulation layer 145 may be formed using an oxide (e.g., USG, SOG, TEOS, PE-TEOS, PSG, BPSG, FOX, HDP-CVD oxide or the like). In example embodiments of the present invention, the fourth insulation layer 145 may be formed using an oxide substantially the same as that of the second insulation layer 135. In other example embodiments of the present invention, the fourth insulation layer 145 may be formed using an oxide substantially different from that of the second insulation layer 135.

The third insulation layer 140 may be formed using a material having an etching selectivity relative to those of the second insulation layer 135 and the fourth insulation layer 145 when a slurry for polishing a metal is used in a polishing process. For example, the third insulation layer 140 may be formed using an oxynitride (e.g., silicon oxynitride) or a nitride (e.g., titanium nitride, silicon nitride or the like). The third insulation layer 140 may be formed using a material having an etching selectivity relative to a preliminary electrode 165 formed in a subsequent process (see FIG. 4E) when the slurry for polishing a metal is used in the polishing process. The third insulation layer 140 may be formed by a CVD process, a PE-CVD process, an ALD process, an HDP-CVD process or similar process.

In example embodiments of the present invention, the fourth insulation layer 145 may be formed having a thickness substantially same as that of the second insulation layer 135. The third insulation layer 140 may be formed to have a thickness substantially thinner than the thickness of the second insulation layer 135 and the fourth insulation layer 145. For example, a thickness ratio of the second insulation layer 135, the third insulation layer 130 and the fourth insulation layer 145 may be in a range of about 0.8:0.2:1.2.

Figure 4D:
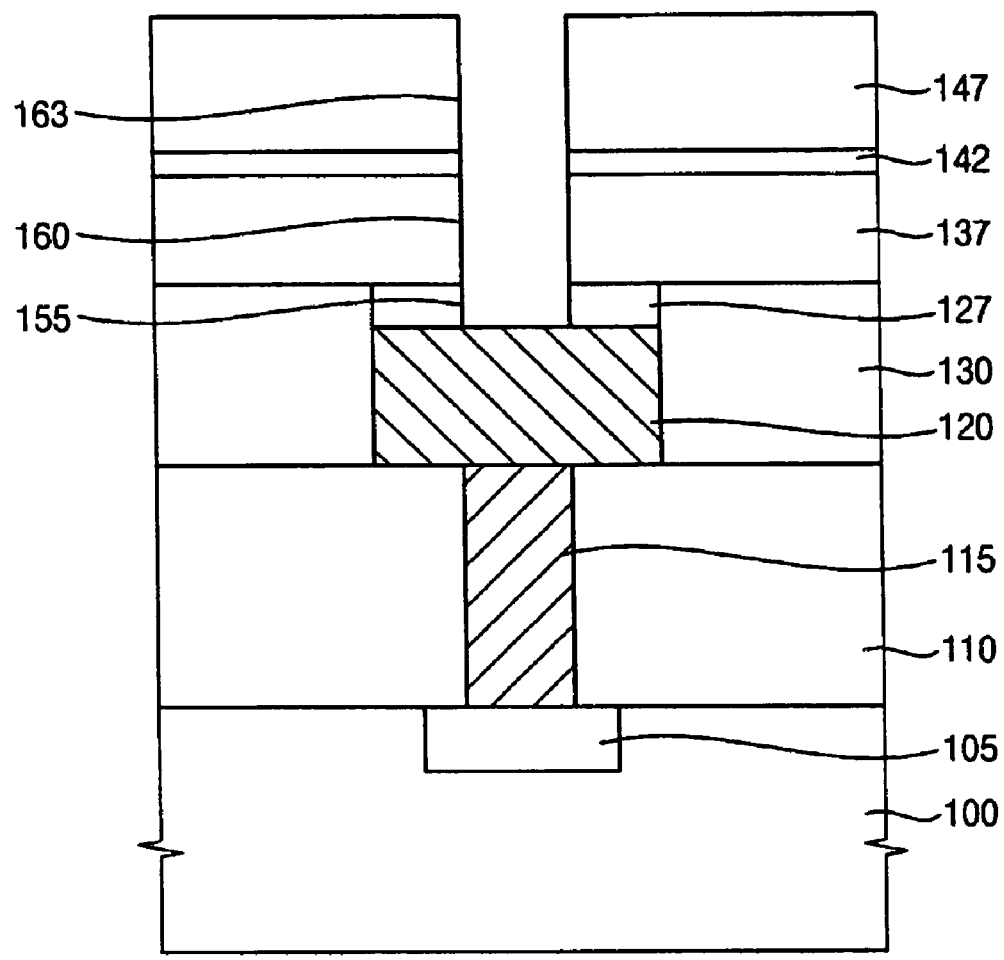

Referring to FIGS. 3 and 4D, a second photoresist pattern (not shown) may be formed on the fourth insulation layer 145. The insulation structure 150 may be partially etched using the second photoresist pattern as an etching mask to form a third opening 163 through the insulation structure 150 in S70. The third opening 163 exposes the second insulation layer 135. For example, the fourth insulation layer 145 and the third insulation layer 140 are sequentially etched, forming a fourth insulation layer pattern 147 and a third insulation layer pattern 142 with the third opening 163.

The second insulation layer 135, exposed through the third opening 163, may be partially etched to form a second opening 160 through the second insulation layer 125 in S80. The second opening 160 exposes the preliminary first insulation layer pattern 125. A second insulation layer pattern 137 having the second opening 160 may be formed on the preliminary first insulation layer pattern 125 and the second insulating interlayer 130.

The preliminary first insulation layer pattern 125, exposed through the second opening 160, may be partially etched to form a first opening 155 in the preliminary first insulation layer pattern 125 in S90. A second insulation layer pattern 127 having the first opening 155 may be formed on the pad 120. The first opening 155 may partially expose the pad 120.

In example embodiments of the present invention, the third opening 163, the second opening 160 and the first opening 155 exposing the pad 120 may be sequentially formed. In other example embodiments of the present invention, the third opening 163, the second opening 160 and the first opening 155 may be simultaneously formed. In still other example embodiments of the present invention, the third opening 163 and the second opening 160 may be simultaneously formed, and then the first opening 155 may be formed.

In example embodiments of the present invention, a diameter of the first opening 155, the second opening 160 and the third opening 163 may be formed be substantially the same. In other example embodiments of the present invention, the first opening 155 may be formed to have a diameter substantially greater than those of the second opening 160 and the third opening 163. In still other example embodiments of the present invention, the third opening 163 may be formed to have a diameter substantially greater than those of the first and the second openings 155 and 160.

In example embodiments of the present invention, a spacer (not shown) may be formed on sidewalls of the first opening 155, the second opening 160 and the third opening 163. The spacer may be formed using a nitride or an oxynitride. When the spacer is formed, the diameters of the first opening 155, the second opening 160 and the third opening 163 may be reduced to twice as a thickness of the spacer. When a preliminary electrode 165 filling the first opening 290, the second opening 295 and the third opening 298 is formed (see FIG. 4E), the likelihood of a seam, a void or a cavity forming in the electrode 310 may be more efficiently prevented or reduced. As a size of the electrode 175 within the first opening 155 and the second opening 160 may be reduced (see FIG. 4G), a current intensity in the electrode 175 may be increased.

Figure 4E:
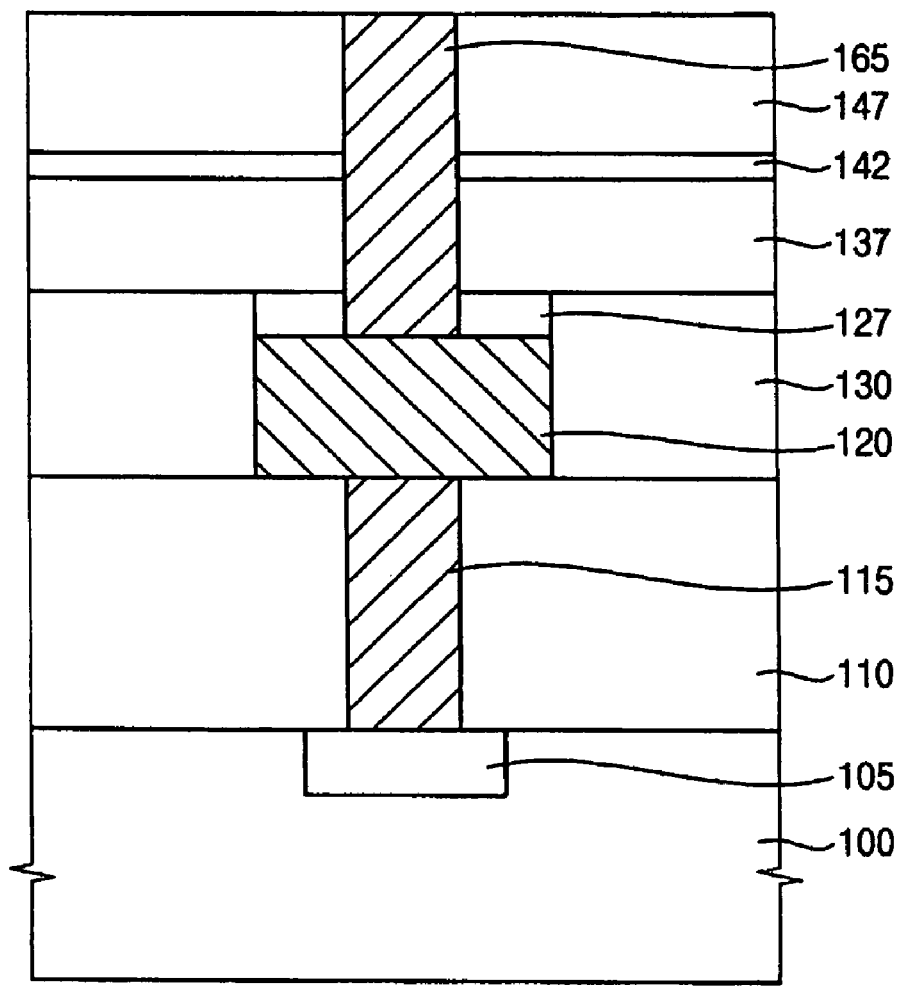

Referring to FIGS. 3 and 4E, a third conductive layer may be formed on the fourth insulation layer pattern 147 to cover the first opening 155, the second opening 160 and the third opening 163 in S100. The third conductive layer may be formed using polysilicon, a metal and/or a conductive metal nitride. For example, the third conductive layer may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or a combination thereof. The third conductive layer may be formed by a sputtering process, a CVD process, an ALD process, a PLD process or similar process.

The third conductive layer may be partially removed by CMP process, an etch back process, or a combination process of CMP and etch back, until the fourth insulation layer pattern 147 is exposed. A preliminary electrode 165 filling the first opening 155, the second opening 163 and the third opening 163 may be formed on the pad 120 in the S100. In example embodiments of the present invention, the third conductive layer may be partially removed by a first CMP process using a first slurry for polishing a metal layer. For example, the preliminary electrode 165 may be formed by the first CMP process using the first slurry for polishing a metal layer (e.g., a tungsten layer). In the first CMP process, the first slurry may include an abrasive (e.g., ceria, silica, alumina or the like). The first slurry may further include an additive for controlling a pH thereof in order to more selectively remove the third conductive layer relative to the fourth insulation layer pattern 147. The fourth insulation layer pattern 147 may function as an etch stop layer in the first CMP process.

Figure 4F:
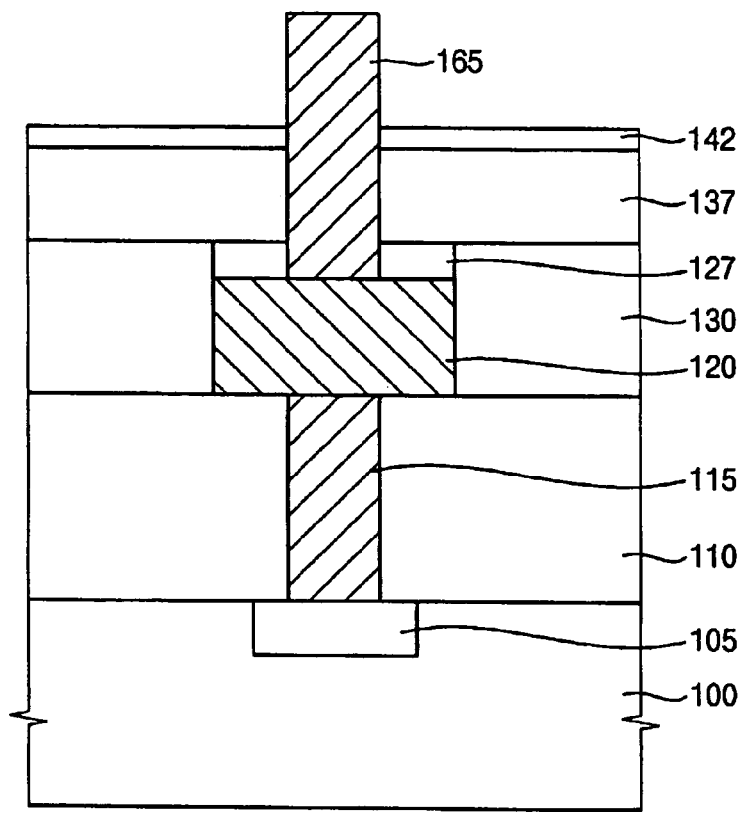

Referring to FIGS. 3 and 4F, the insulation structure 150 may be partially removed in S110. For example, the fourth insulation layer pattern 147 may be removed to expose the third insulation layer pattern 142. The fourth insulation layer pattern 147 may be removed by an etching process. The etching process may include wet etching process or a dry etching process. In the etching process for the fourth insulation layer pattern 147, the third insulation layer pattern 142 may function as an etch stop layer. As the fourth insulation layer pattern 147 is removed, the preliminary electrode 165 filling the first opening 155 and the second opening 160 may be protruded from a surface of the third insulation layer pattern 142. An upper portion of the preliminary electrode 165, on the third insulation layer pattern 142, may have a pillar shape.

Figure 4G:
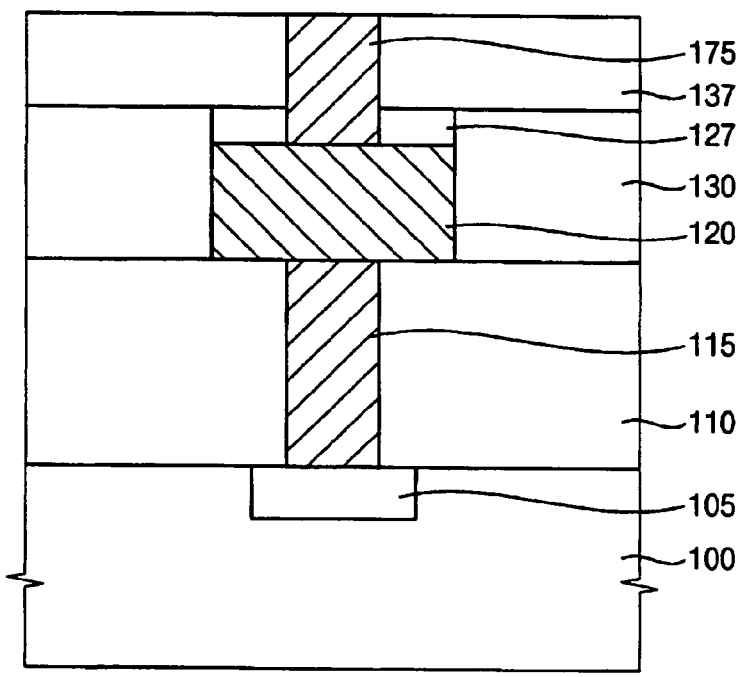

Referring to FIGS. 3 and 4g, the insulation structure 150 may be removed. The upper portion of the preliminary electrode 165 having the pillar shape may be removed to form an electrode 175 in S120. The third insulation layer pattern 142 and the upper portion of the preliminary electrode 165 may be removed by a second CMP process using a second slurry. In the second CMP process, the second insulation layer pattern 137 may function as an etch stop layer. The second slurry may be used for polishing a metal layer (e.g., tungsten layer) and may include an abrasive (e.g., silica, ceria, alumina or the like). The second slurry may further include an additive for controlling a pH thereof in order to more selectively remove the third insulation layer pattern 142 and the preliminary electrode 165 relative to the second insulation layer pattern 137. Etching damage of the second insulation layer pattern 137 from the second CMP process may be prevented or reduced. After the second CMP process, variations in the thickness of the second insulation layer pattern 137 may be prevented, or retarded, such that roughness of the electrode 175 and the second insulation layer pattern 137 may decrease.

A phase-change memory device and method of manufacturing the same will now be described.

Figure 5:
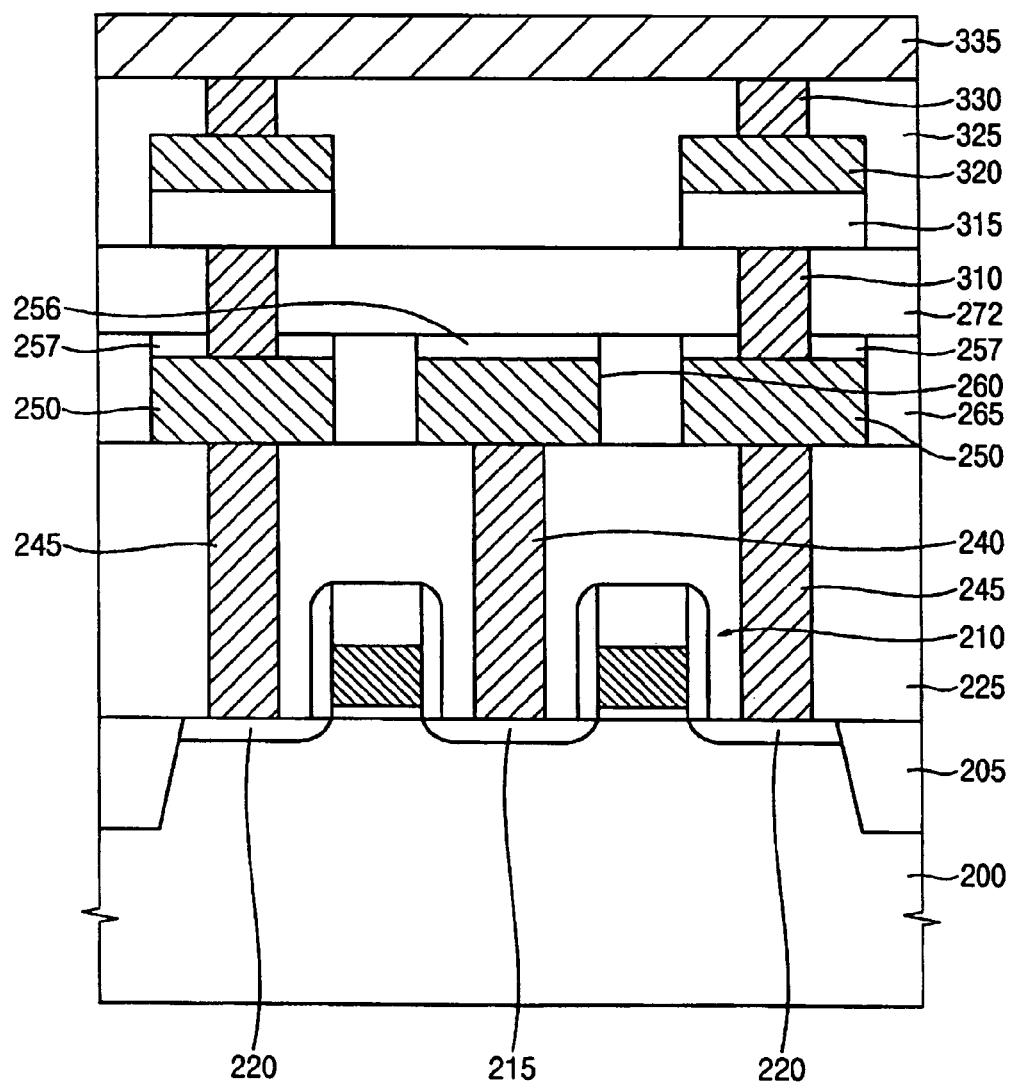

FIG. 5 is a diagram illustrating a cross sectional view of a phase-change memory device according to example embodiments of the present invention.

Referring to FIG. 5, a phase-change memory device includes a substrate 200 having a lower structure, a first insulating interlayer 225, a first contact 240, a second contact 245, a pad 250, a lower wiring 260, a first insulation layer pattern 257, a mask pattern 256, a second insulating interlayer 265, a second insulation layer pattern 272, a first electrode 310, a phase-change layer pattern 315, a second electrode 320, a third insulating interlayer 325, an upper contact 330 and/or an upper wiring 335.

The lower structure may include a first contact region 215, a second contact region 220 and/or a gate structure 210 formed on the substrate 200.

The first insulating interlayer 225 may be formed on the substrate 200 to cover the lower structure. The first insulating interlayer 225 may include an oxide (e.g., USG, FOX, SOG, BPSG, PSG, TEOS, PE-TEOS, HDP-CVD oxide or the like).

The first contact 240 and the second contacts 245 may contact the first contact region 215 and the second contact region 220 through the first insulating interlayer 225. The first contact 240 and the second contacts 245 may include metal or conductive metal nitride.

The lower wiring 260 may be formed on the first contact 240 and the first insulating interlayer 225. The pad 250 may be formed on the second contact 245 and the first insulating interlayer 225. The pad 250 and the lower wiring 260 may include doped polysilicon, a metal or a conductive metal nitride. The mask pattern 256 may be formed on the lower wiring 260. The first insulation layer pattern 257 having a first opening exposing the pad 250 may be formed on the pad 250. The first insulation layer pattern 257 and the mask pattern 256 may include an oxynitride or a nitride.

The pad 250 and the lower wiring 260 may be in the second insulating interlayer 265. The second insulating interlayer 265 may include an oxide (e.g., USG, FOX, SOG, BPSG, PSG, TEOS, PE-TEOS, HDP-CVD oxide or the like).

The second insulation layer pattern 272 may be formed on the second insulating interlayer 265, the first insulation layer pattern 257 and the mask pattern 256. The second insulation layer pattern 272 may have a second opening that exposes the pad 250 through the first opening. The second insulation layer pattern 272 may include an oxide (e.g. USG, FOX, SOG, BPSG, PSG, TEOS, PE-TEOS, HDP-CVD oxide or the like).

The first electrode 310 may be formed on the pad 250 to fill the first opening and the second opening. The first electrode 310 may be electrically connected with the second contact region 220 through the pad 250 and the second contact 245. The first electrode 310 may include polysilicon, tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or a mixture thereof.

The phase-change layer pattern 315 may be formed on the first electrode 310 and the second insulation layer pattern 272. The phase-change layer pattern 315 may include chalcogenide or chalcogenide alloy. For example, the phase-change layer pattern 178 may include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), an element in Group VA (e.g., tantalum (Ta), niobium (Nb)), a Group VA element-antimony-tellurium (e.g., tantalum-antimony-tellurium (Ta—Sb—Te), niobium-antimony-tellurium (Nb—Sb—Te) or vanadium-antimony-tellurium (V—Sb—Te)), an element in Group VIA (e.g., tungsten, molybdenum or chrome-antimony-tellurium), a Group VA element-antimony-selenium (e.g., tantalum-antimony-selenium (Ta—Sb—Se), niobium-antimony-selenium (Nb—Sb—Se) or vanadium-antimony-selenium (V—Sb—Se)), a Group VIA element-antimony-tellurium (e.g., tungsten-antimony-tellurium (W—Sb—Te), molybdenum-antimony-tellurium (Mo—Sb—Te), or chrome-antimony-tellurium (Cr—Sb—Te)) or a Group VIA element-antimony-selenium (e.g., tungsten-antimony-selenium (W—Sb—Se), molybdenum-antimony-selenium (Mo—Sb—Se) or chrome-antimony-selenium (Cr—Sb—Se)) or the like.

Although the phase-change layer pattern is described above as being formed primarily of ternary phase-change chalcogenide alloys, the chalcogenide alloy of the data storage layer could be selected from a binary phase-change chalcogenide alloy or a quaternary phase-change chalcogenide alloy. Example binary phase-change chalcogenide alloys may include one or more of Ga—Sb, In—Sb, In—Se, Sb2-Te3 or Ge—Te alloys; example quaternary phase-change chalcogenide alloys may include one or more of an Ag—In—Sb—Te, (Ge—Sn)—Sb—Te, Ge—Sb—(Se—Te) or Te81-Ge15-Sb2-S2 alloy, for example.

The second electrode 320 may be formed on the phase-change layer pattern 315. The second electrode 320 may include doped polysilicon, a metal and/or a conductive metal nitride.

The third insulating interlayer 325 to cover the phase-change layer pattern 315 and the second electrode 320 may be formed on the second insulation layer pattern 272. The third insulating interlayer 325 may include an oxide (e.g., USG, FOX, SOG, BPSG, PSG, TEOS, PE-TEOS, HDP-CVD oxide or the like).

The upper contact 330 may be formed in a portion of the third insulating interlayer 325. The upper contact 330 may contact the second electrode 320. The upper contact 330 may include a metal or a conductive metal nitride. The upper wiring 335 may be formed on the upper contact 330 and the third insulating interlayer 325. The upper wiring 335 may be electrically connected with the second electrode 320. The upper wiring 335 may include polysilicon, a metal or a conductive metal nitride.

FIGS. 6A to 6I are diagrams illustrating cross sectional views of a method of manufacturing a phase-change memory device according to example embodiments of the present invention.

Figure 6A:
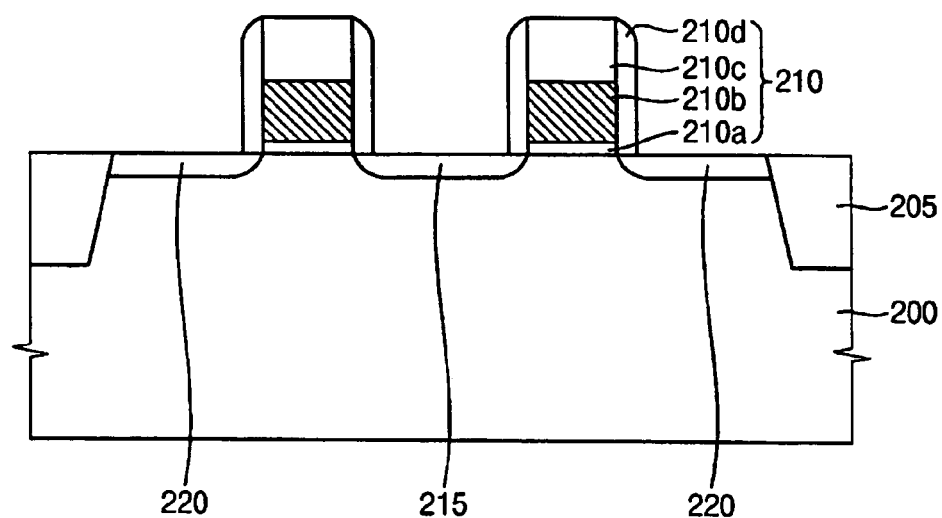

Referring to FIG. 6A, an isolation layer 205 may be formed on a substrate 200 by an isolation process (e.g., a shallow trench isolation (STI) process) or a local oxidation of silicon (LOCOS) process to define an active region and a field region.

A gate oxidation layer, a gate conductive layer and a gate mask layer may be formed on the substrate. The gate oxidation layer, the gate conductive layer and the gate mask layer may be sequentially patterned to form a gate oxidation layer pattern 210a, a gate conductive layer pattern 210b and a gate mask 210c on the substrate 200. The gate conductive layer may be formed in a single-layer structure that includes polysilicon or a metal. Alternatively, the gate conductive layer may have a multi-layer structure that includes a polysilicon layer and a metal layer. The gate mask layer may be formed using a material that has an etching selectivity relative to the gate conductive layer and the gate oxidation layer. For example, the gate mask layer may be formed using a nitride (e.g., silicon nitride) or an oxynitride (e.g., silicon nitride).

A nitride layer may be formed on the substrate 200 to cover the gate mask 210c, the gate conductive layer pattern 210b and/or the gate oxidation layer pattern 210a. The nitride layer may be anisotropically etched to form a gate spacer 210d. The gate spacer 210d may be formed on sidewalls of the gate mask 210c, the gate conductive layer pattern 210b and/or the gate oxidation layer pattern 210a. A gate structure 210 including the gate oxidation layer pattern 210a, the gate conductive layer pattern 210b, the gate mask 210c and/or the gate spacer 210d may be formed on the substrate 200.

Impurities may be implanted in portions of the substrate 200 exposed between the gate structures 210 using the gate structures 210 as an ion implantation mask. The first contact region 215 and the second contact region 220 may be formed in the substrate 200 by an ion implantation process and a thermal treatment process. Transistors (including the gate structures 210), the first contact region 215 and the second contact region 220 may be formed on the substrate 200. For example, the first contact region 215 may correspond to a source region. The second contact region 220 may correspond to a drain region.

Figure 6B:
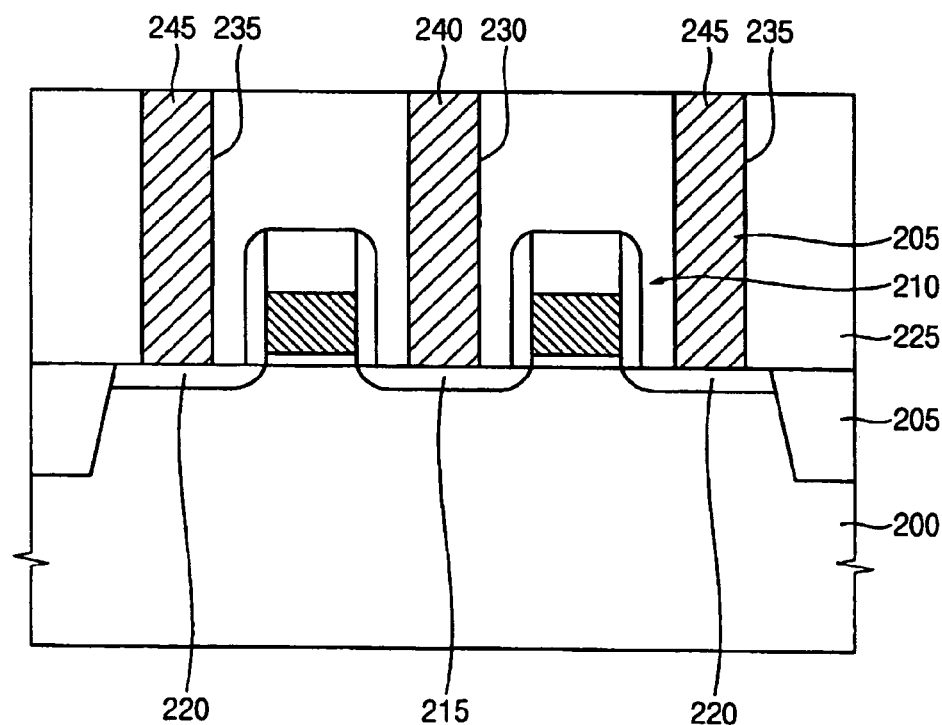

Referring to FIG. 6B, the first insulating interlayer 225 may be formed on the substrate 200 to cover the gate structures 210. The first insulating interlayer 225 may be formed using an oxide (e.g., BPSG, PSG, TEOS, USG, FOX, SOG, PE-TEOS, HDP-CVD oxide or the like). In example embodiments of the present invention, the first insulating interlayer 225 may be planarized by a CMP process, an etch back process or a combination of CMP and etch back.

The first insulating interlayer 225 may be partially etched to form a first contact hole 230 and a second contact hole 235. The first contact hole 230 and the second contact hole 235 may be formed on the first contact region 215 and the second contact region 220, respectively. The first contact holes 230 and the second contact hole 235 expose the first contact region 215 and the second contact region 220, respectively.

A first conductive layer may be formed on the first insulating interlayer 225 to fill the first contact hole 230 and the second contact hole 235. The first conductive layer may be formed using doped polysilicon, titanium, copper, tantalum, tungsten, aluminum, titanium nitride, tungsten nitride, aluminum nitride, titanium aluminum nitride or a mixture thereof.

The first conductive layer may be partially removed by a CMP process, an etch back process or a combination process of CMP and etch back, until the first insulating interlayer 225 is exposed. The first contact 240 may be formed in the first contact hole 230. The second contact 245 may be simultaneously formed in the second contact hole 235. The first contact 240 may contact the first contact region 215. The second contact 245 may contact with the second contact region 230.

Figure 6C:
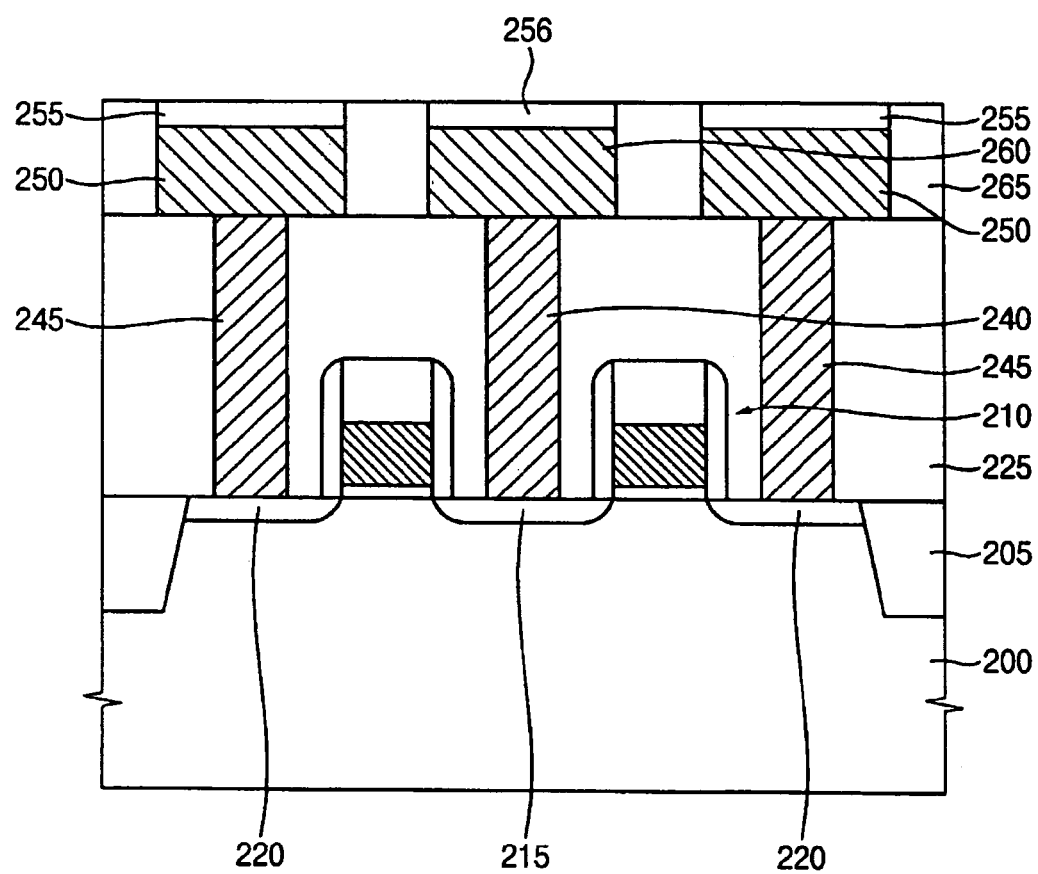

Referring to FIG. 6C, a second conductive layer may be formed on the first contact 240, the second contact 245 and the first insulating interlayer 225. The second conductive layer may be formed using polysilicon, a metal or a conductive metal nitride. For example, the second conductive layer may be formed using tungsten, titanium, aluminum, tantalum, copper, tungsten nitride, titanium nitride, tantalum nitride, titanium aluminum nitride or a mixture thereof.

A first insulation layer may be formed on the second conductive layer. The first insulation layer may be formed by a CVD process, a PE-CVD process or an HDP-CVD process. The CVD process, the PE-CVD process or the HDP-CVD process may use silicon nitride or silicon oxynitride.

A first photoresist pattern (not shown) may be formed on the first insulation layer. The first insulation layer may be etched using the first photoresist film as an etching mask to form a preliminary first insulation layer pattern 255 and a mask pattern 256 on the second conductive layer. The preliminary first insulation layer pattern 255 may be formed above the second contact 245, below the second conductive layer. The mask pattern 256 may be formed above the first contact 240.

The second conductive layer may be etched using the preliminary first insulation layer pattern 255 and the mask pattern 256 as etching masks. A lower wiring 260 and a pad 250 are formed on the first contact 240 and the second contact 245, respectively. The lower wiring 260 may be formed on the first contact 240. The lower wiring 260 may be electrically connected to the first contact region 215. The pad 250 may be formed on the second contact 245. The pad 250 may be electrically connected with the second contact region 220.

A second insulating interlayer 265 may be formed on the first insulating interlayer 225, the preliminary first insulation layer pattern 255 and/or the mask pattern 256. The second insulating interlayer 265 may be formed using an oxide (e.g., TEOS, FOX, PE-TEOS, BPSG, PSG, SOG, HDP-CVD oxide or the like).

The second insulating interlayer 265 may be partially removed by a CMP process, an etch back process or a combination of CMP and etch back, until the preliminary first insulation layer pattern 255 and the mask pattern 256 are exposed. The pad 250 and the preliminary first insulation layer pattern 255 may be within the second insulating interlayer 265. The lower wiring 260 and the mask pattern 256 may be within the second insulating interlayer 265.

Figure 6D:
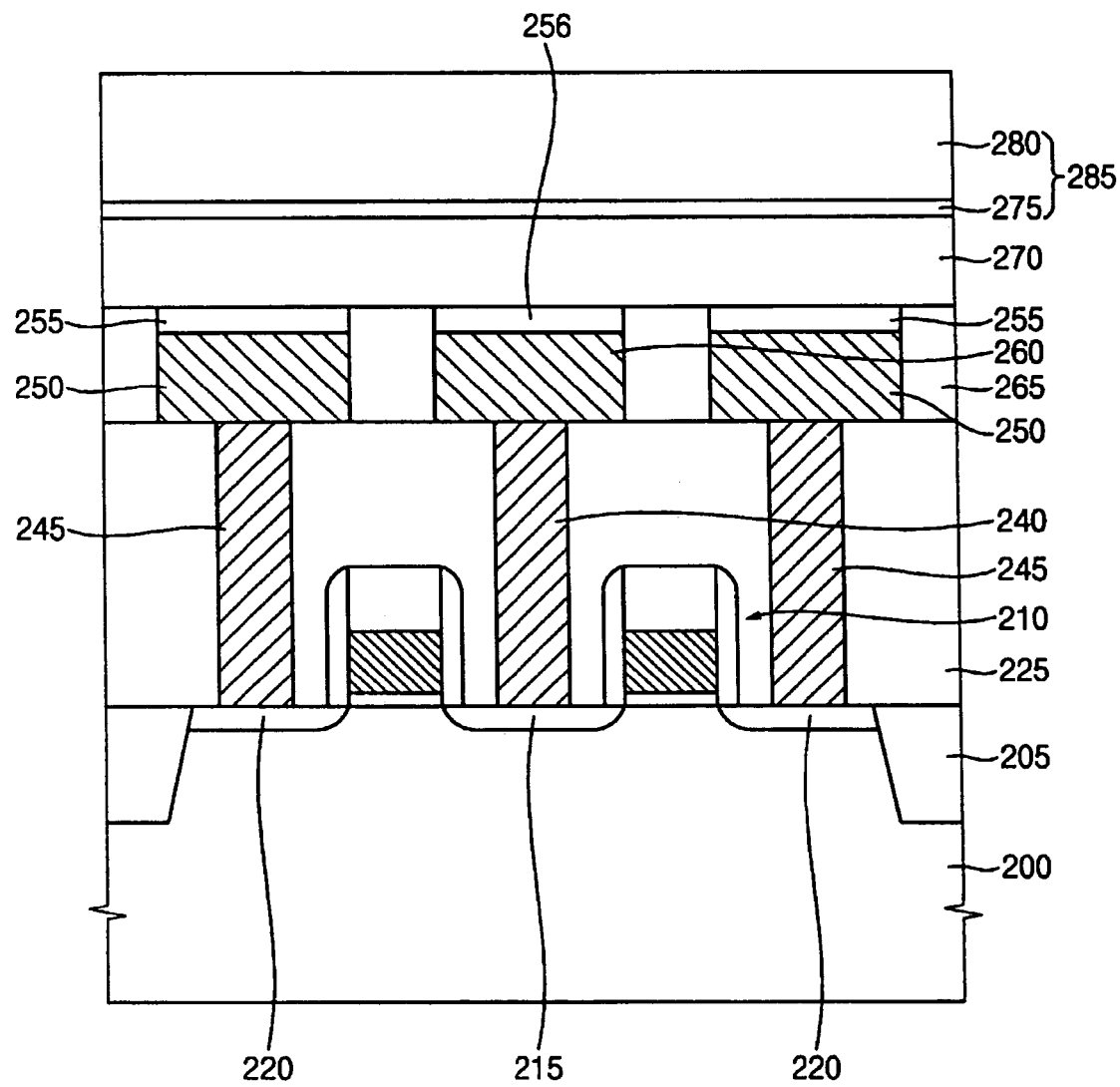

Referring to FIG. 6D, a second insulation layer 270 may be formed on the preliminary first insulation layer pattern 255, the mask pattern 256 and the second insulating interlayer 265. An insulation structure 285 including a third insulation layer 275 and a fourth insulation layer 280 may be formed on the second insulation layer 270. The second insulation layer 270 and the fourth insulation layer 280 may be formed using a material that has an etching selectivity relative to that of a preliminary electrode 305 formed in a subsequent process (see FIG. 6F). For example, the second insulation layer 270 and the fourth insulation layer 280 may be formed using an oxide (e.g., TEOS, BPSG, PSG, FOX, USG, PE-TEOS, SOG, HDP-CVD oxide or the like). When the second insulation layer 270 and the fourth insulation layer 280 are formed using the oxide, the third insulation layer 275 may formed using an oxynitride (e.g., silicon oxynitride) or a nitride (e.g., silicon nitride, titanium nitride) or the like.

In example embodiments of the present invention, the fourth insulation layer 280 may be formed having a thickness substantially same as that of the second insulation layer 270. The third insulation layer 275 may be formed to have a thickness substantially thinner than the thickness of the second insulation layer 270 and the fourth insulation layer 280. For example, the second insulation layer 270, the third insulation layer 275 and the fourth insulation layer 280 may have a thickness ratio of about 0.8:0.2:1.2.

Figure 6E:
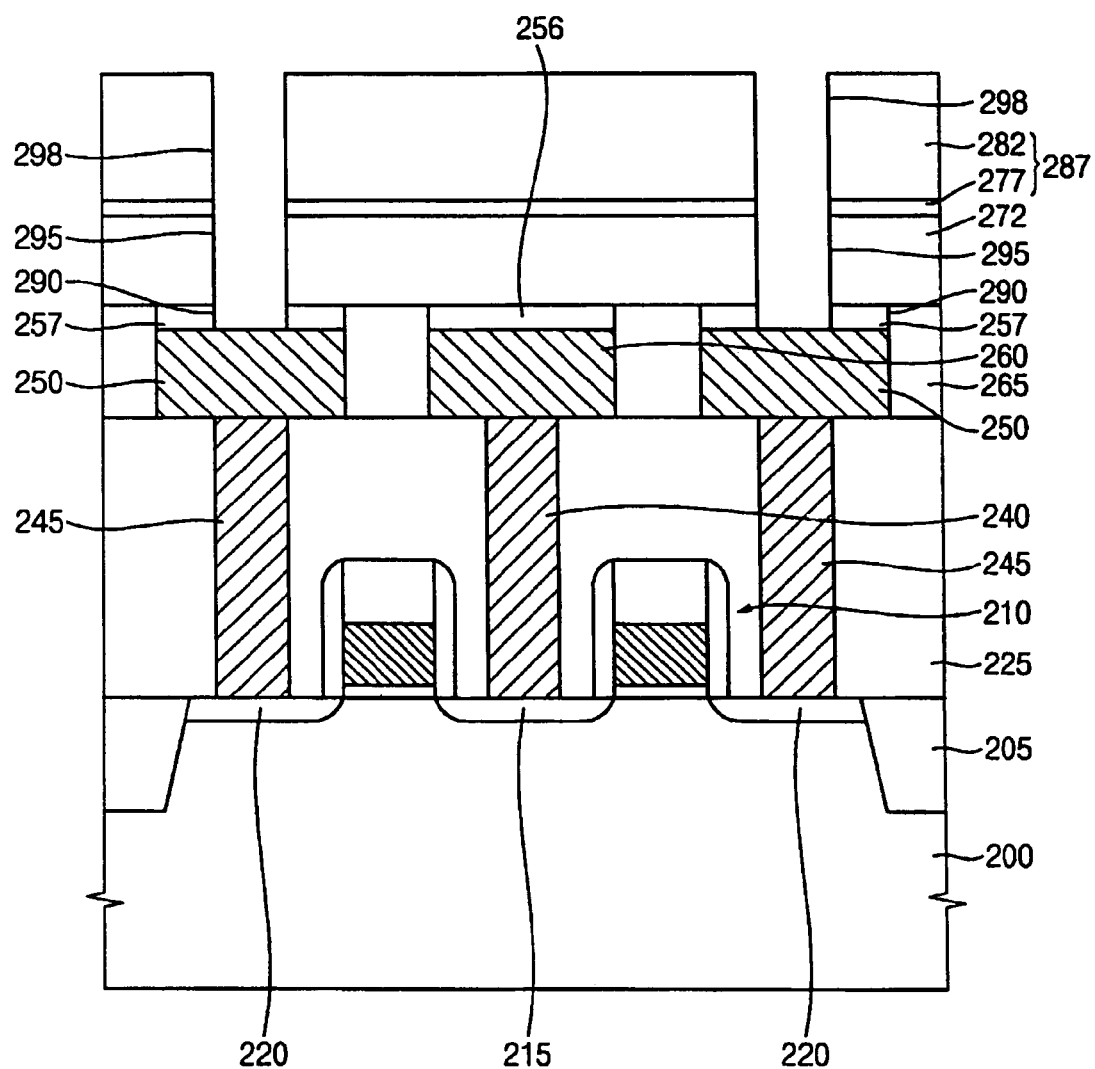

Referring to FIG. 6E, a second photoresist pattern (not shown) may be formed on the insulation structure 285. The insulation structure 285 may be partially etched using the second photoresist pattern as an etching mask to form an insulation structure pattern 287 including a third insulation layer pattern 277 and a fourth insulation layer pattern 282. For example, the fourth insulation layer 280 and the third insulation layer 275 may be sequentially etched to form a third opening 298 in the fourth insulation layer 280 and the third insulation layer 275. The third opening 298 may expose the second insulation layer 270. The insulation structure pattern 287, which includes the third insulation layer pattern 277 and the fourth insulation layer pattern 282 having the third opening 298, may be formed.

The second insulation layer pattern 270 exposed through the third opening 298 may be anisotropically etched to form a second insulation layer pattern 272. The second insulation layer pattern 272 may have a second opening 295 that exposes the preliminary first insulation layer pattern 255.

The preliminary first insulation layer pattern 255 may be partially etched through the second opening 295 to form a first opening 290 connected to the second opening 295. A first insulation layer pattern 257 that includes the first opening 290 exposing the pad 250 may be formed. In example embodiments of the present invention, a diameter of the first opening 290, the second opening 295 and the third opening 298 may be substantially the same. In other example embodiments of the present invention, the first opening 290 may be formed to have a diameter substantially greater than those of the second opening 295 and the third opening 298. In still other example embodiments of the present invention, the third opening 295 may be formed to have a diameter substantially greater than those of the first opening 290 and the second opening 295.

In example embodiments of the present invention, a spacer (not shown) may be formed on sidewalls of the first opening 290, the second opening 295 and the third opening 298. When the spacer is formed, the diameters of the first opening 290, the second opening 295 and the third opening 298 may be reduced. When a preliminary electrode 305 filling the first opening 290, the second opening 295 and the third opening 298 is formed (see FIG. 6F), formation of a seam, a void or a cavity in the preliminary electrode 305 may be more effectively prevented or reduced. As a size of an electrode is reduced, a current intensity passing through the electrode may be increased. As such, a current intensity necessary for obtaining a desired phase-change region may be reduced in order that the phase-change memory device may operate at a lower current.

Figure 6F:
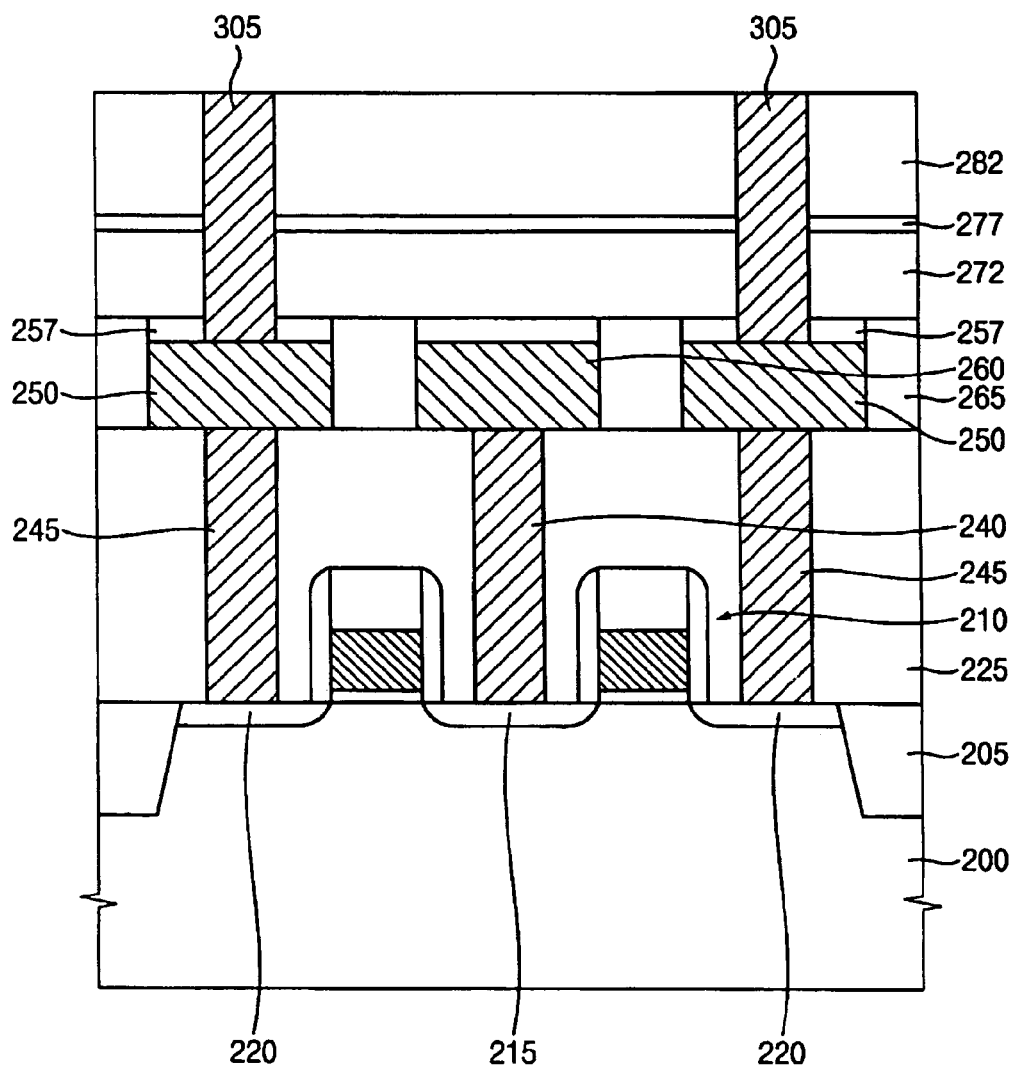

Referring to FIG. 6F, a third conductive layer may be formed on the fourth insulation layer pattern 282 to fill the first opening 290, the second opening 295 and the third opening 298. The third conductive layer may be formed using a metal nitride or a metal oxynitride. For example, the third conductive layer may be formed using titanium nitride, tungsten nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride or a mixture thereof. The third conductive layer may be formed by a sputtering process, a CVD process, an ALD process, a PLD process or similar process.

The third conductive layer may be partially removed until the fourth insulation layer pattern 282 is exposed. A preliminary electrode 305 may be formed within the first opening 290, second opening 295 and third opening 298. In example embodiments of the present invention, the preliminary electrode 305 may be formed by a first CMP process using a first slurry for polishing a metal layer. In the first CMP process, the first slurry may include an abrasive (e.g., ceria, silica, alumina or the like). The first slurry may further include an additive for controlling a pH. The third conductive layer has an etching selectivity relative to that of the fourth insulation layer pattern 282 when the first slurry is used in the first CMP process. In the first CMP process for forming the preliminary electrode 305, the fourth insulation pattern 282 may function as an etch stop layer.

Figure 6G:
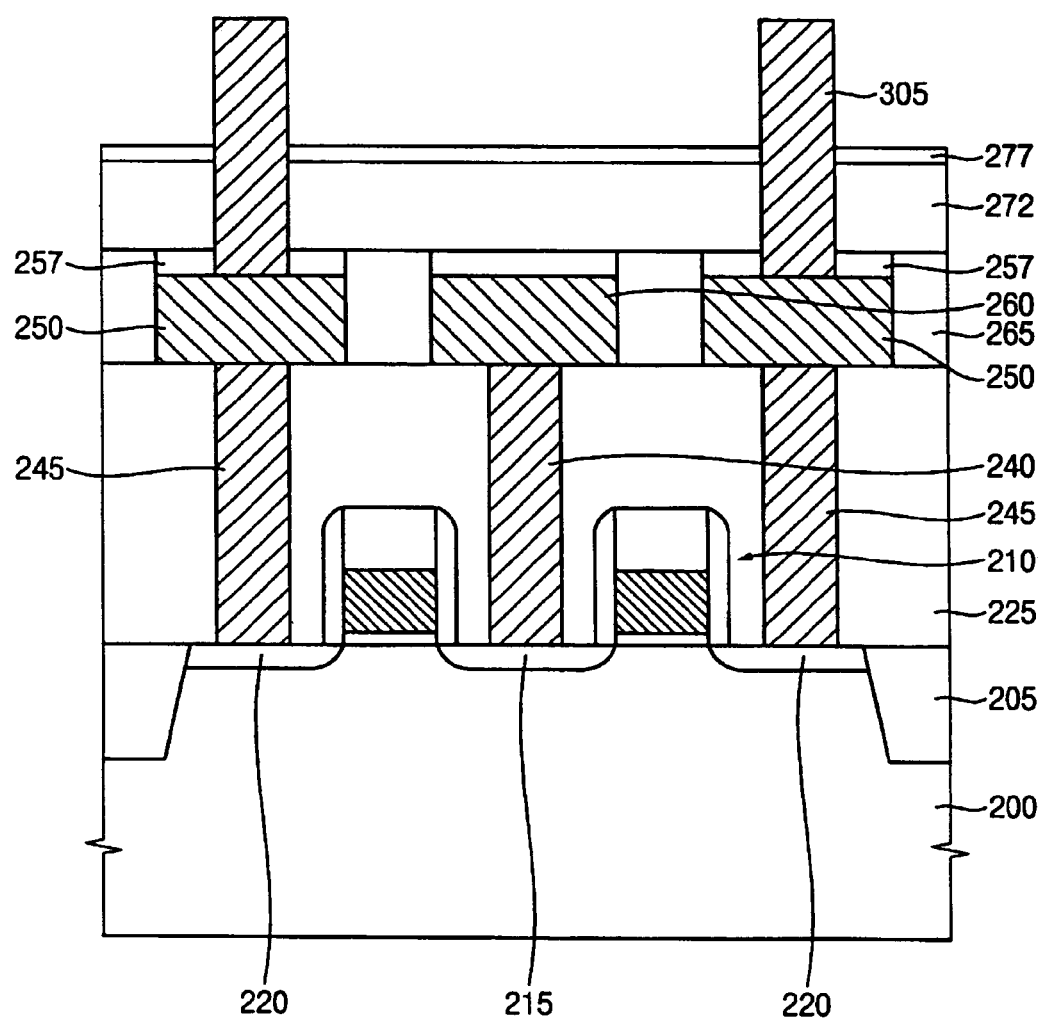

Referring to FIG. 6G, the fourth insulation layer pattern 282 may be removed to expose the third insulation layer pattern 277. The fourth insulation layer pattern 282 may be removed by an etch back process. When the fourth insulation layer pattern 282 is etched, the third insulation layer pattern 277 may be function as an etch stop layer. As the fourth insulation layer pattern 282 is removed, an upper portion of the preliminary electrode 305 filling the first opening 290 and second opening 295 may have a pillar shape.

Figure 6H:
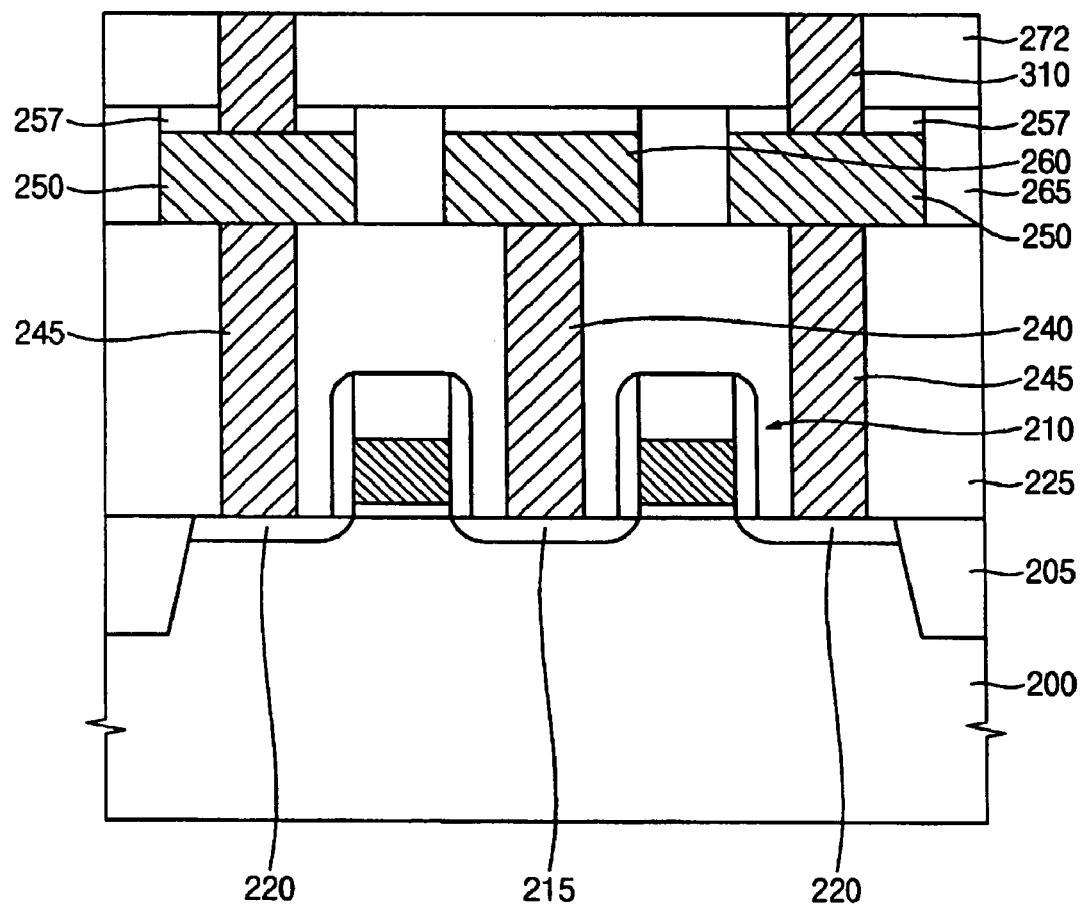
Figure 61:
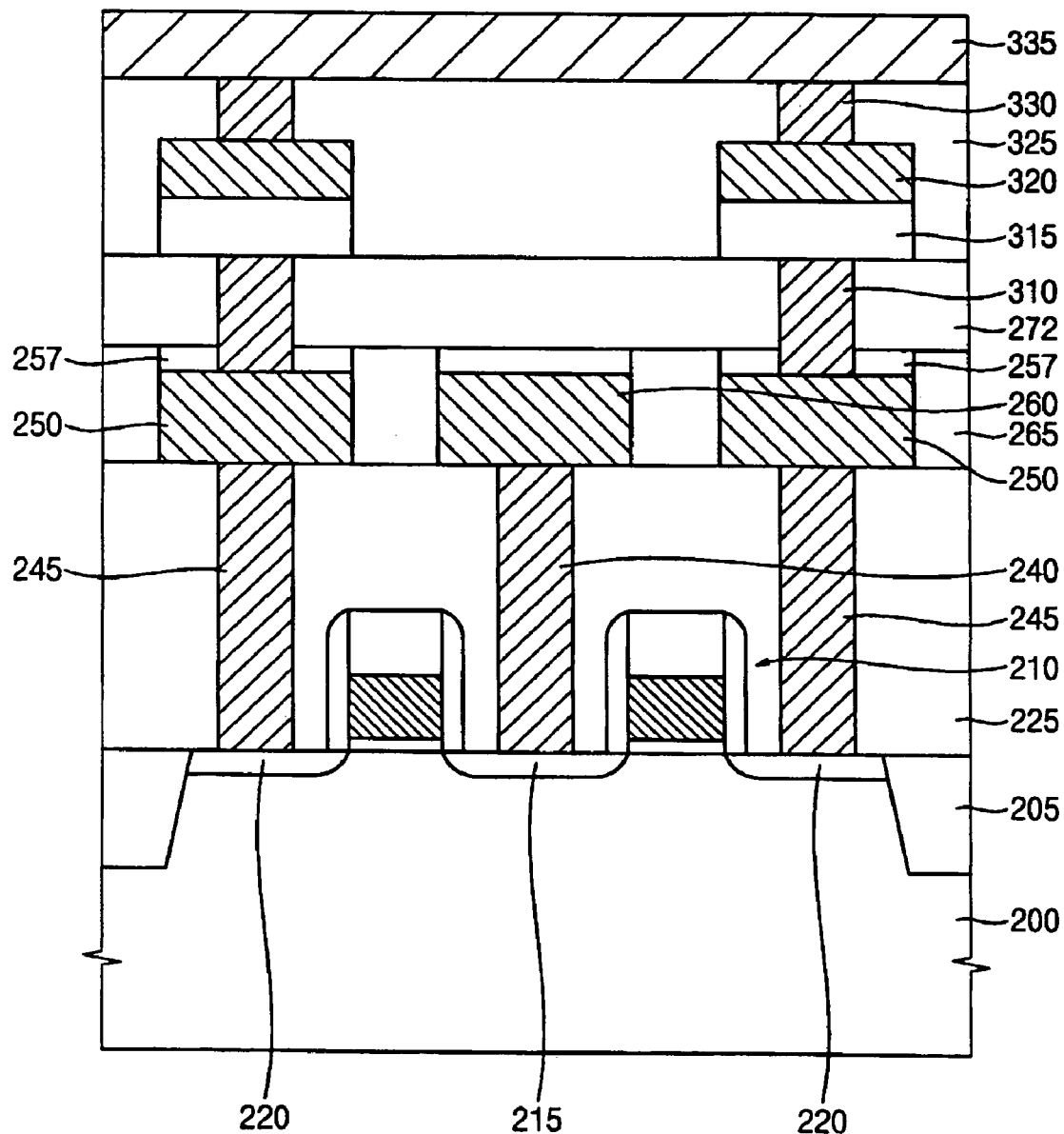

Referring to FIG. 6H, the third insulation layer pattern 277 and the upper portion of the preliminary electrode 305 may be removed by a second CMP process until the second insulation layer pattern 272 is exposed. A first electrode 310 may be formed. The first electrode 310 may contact the pad 250. The first electrode 310 may fill the first opening 290 and the second opening 295. In the second CMP process, the second insulation layer pattern 272 may function as an etch stop layer. In the second CMP process, a second slurry for polishing a metal layer may be used. The second slurry may include an abrasive (e.g., silica, ceria, aluminum or the like). The second slurry may further include an additive for controlling a pH thereof such that the preliminary electrode 305 may have an etching selectivity relative to that of the second insulation layer pattern 272. In the second CMP process using the second slurry, etching damage to the second insulation layer pattern 272 may be prevented or reduced. After the second CMP process, a remaining second insulation layer pattern 272 may have a more uniform thickness.

The first electrode 310 may correspond to a lower electrode in the phase-change memory device. The first insulation layer pattern 257 may surround a lower portion of the first electrode 310 within the second insulation layer pattern 272. The first insulation layer pattern 257 may support the first electrode 310. For example, the lower portion of the first electrode 310 may be supported by the first insulation layer pattern 257. An upper portion of the first electrode 310 may be supported by the second insulation layer pattern 272. A structural stability of the first electrode 310 may increase.

Referring to FIG. 6I, a phase-change layer may be formed on the first electrode 310 and the second insulation layer pattern 272. The phase-change layer may be formed using a chalcogenide or chalcogenide alloy (as discussed above). The phase-change layer may be formed by a sputtering process, a CVD process or similar process.

A fourth conductive layer may be formed on the phase-change layer. The fourth conductive layer may be formed by a sputtering process, a CVD process, an ALD process, a PLD process or similar process. The fourth conductive layer may be formed using a conductive material having nitrogen, a metal and/or a metal silicide.

The fourth conductive layer and the phase-change layer may be sequentially patterned. A phase-change layer pattern 315 and a second electrode 320 may be formed on the first electrode 310 and the second insulation layer pattern 272. The second electrode 320 may correspond to an upper electrode in the phase-change memory device.

A third insulating interlayer 325 may be formed on the second insulation layer pattern 127 to cover the second electrode 320. The third insulating interlayer 325 may be form using an oxide (e.g., TEOS, BPSG, PSG, SOG, USG, HDP-CVD oxide or the like). The third insulating interlayer 325 may be formed by a CVD process, a PE-CVD process, an ALD process, an HDP-CVD process or a similar process.

The third insulating interlayer 325 may be partially etched to form a third contact hole exposing the second electrode 320. A fifth conductive layer may be formed on the third insulating interlayer 325 to fill the third contact hole. The fifth conductive layer may be partially removed until the third insulating interlayer 325 is exposed. An upper contact 330, contacting the second electrode 320, may be formed in the third contact hole.

An upper wiring 335 electrically connected with the second electrode 320 may be formed on the upper contact 330 and the third insulating interlayer 325.

According to example embodiments of the present invention, a first insulation layer pattern and a second insulation layer pattern may surround and support an electrode such that structural stability of an electrode structure may increase. In a chemical mechanical polishing process for forming the electrode, the second insulation layer pattern may have an etching selectivity relative to that of the electrode. The second insulation layer may have a more uniform thickness and roughness of the electrode also may decrease. When the electrode structure is used in a phase-change memory device, the phase-change memory device may have a more consistent resistance and increased characteristics.

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing an electrode structure, comprising:
   forming a pad;
   forming a first insulation layer pattern on the pad, the first insulation layer pattern having a first opening partially exposing the pad;
   forming a second insulation layer pattern on the first insulation layer pattern;
   forming a third insulation layer on the second insulation layer, the third insulation layer having an etching selectivity relative to the second insulation layer;
   forming a fourth insulation layer on the third insulation layer;
   forming an opening through the first, second, third and fourth insulation layers to partially expose the pad;
   forming a preliminary electrode electrically connected to the pad in the opening;
   removing the fourth and the third insulation layers to expose a portion of the preliminary electrode; and
   removing the exposed portion of the preliminary electrode.

2. The method of claim 1, wherein the preliminary electrode is formed by a first chemical mechanical polishing (CMP) process using a first slurry.

3. The method of claim 1, wherein the fourth insulation layer pattern is removed by a wet etching process or a dry etching process.

4. The method of claim 1, wherein the third insulation layer pattern and the upper portion of the preliminary electrode are removed by a second chemical mechanical polishing (CMP) process using a second slurry.

5. The method of claim 1, wherein the third insulation layer is formed having a thickness $t_3$, the second insulation layer is formed having a thickness $t_2$, the fourth insulation layer is formed having a thickness $t_4$, wherein the expressions $t_3<t_2$ and $t_3<t_4$ are satisfied.

6. The method of claim 1, further comprising forming a spacer on sidewalls of the first and the second openings, prior to forming the electrode.

7. The method of claim 1, wherein removing the fourth and the third insulation layers includes removing the fourth insulation layer using the third insulation layer as an etch stop layer.

* * * * *